(12) United States Patent
Ocker et al.

(10) Patent No.: US 11,195,589 B1
(45) Date of Patent: Dec. 7, 2021

(54) MEMORY CELL ARRANGEMENT AND METHODS THEREOF

(71) Applicant: Ferroelectric Memory GmbH, Dresden (DE)

(72) Inventors: Johannes Ocker, Dresden (DE); Haidi Zhou, Dresden (DE); Stefan Müller, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 16/930,131

(22) Filed: Jul. 15, 2020

(51) Int. Cl.
*G11C 11/34* (2006.01)
*G11C 16/30* (2006.01)
*G11C 16/10* (2006.01)
*G11C 16/32* (2006.01)

(52) U.S. Cl.
CPC .............. *G11C 16/30* (2013.01); *G11C 16/10* (2013.01); *G11C 16/32* (2013.01)

(58) Field of Classification Search
CPC ..... G11C 16/10; G11C 11/5628; G11C 16/12; G11C 16/0483; G11C 16/3454
USPC ....................................... 365/185.18, 185.19
See application file for complete search history.

(56) References Cited

U.S. PATENT DOCUMENTS

| | | | |
|---|---|---|---|
| 6,825,517 B2 | 11/2004 | Dimmer | |
| 9,530,494 B2 * | 12/2016 | Lee | ................... G11C 13/0033 |
| 10,424,379 B2 | 9/2019 | Slesazek | |
| 2009/0086538 A1 * | 4/2009 | Jenne | ................ G11C 16/3418 365/185.02 |
| 2015/0023093 A1 * | 1/2015 | Schneider | ........... G11C 11/1675 365/158 |

* cited by examiner

*Primary Examiner* — Son T Dinh
(74) *Attorney, Agent, or Firm* — Hickman Becker Bingham Ledesma LLP; Malgorzata A. Kulczycka

(57) ABSTRACT

According to various aspects, a memory cell arrangement is provided, the memory cell arrangement including a control circuit configured to carry out a de-trapping writing scheme to write at least one memory cell of the memory cell arrangement into a memory state, the de-trapping writing scheme including providing one or more write voltage pulses and one or more de-trapping voltage pulses at the at least one memory cell, wherein the one or more de-trapping voltage pulses have opposite polarity with respect to the one or more write voltage pulses, and wherein one or more properties of the one or more write voltage pulses and of the one or more de-trapping voltage pulses are varied as long as the memory cell is not in the memory state.

20 Claims, 11 Drawing Sheets

MEMORY CELL ARRANGEMENT AND METHODS THEREOF

TECHNICAL FIELD

Various aspects relate to a memory cell arrangement, and methods thereof, e.g. a method for operating a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. The memory cells may be implemented in such a way that each single memory cell or at least various groups of memory cells is/are unambiguously addressable, e.g. for writing (e.g. programming and/or erasing) and/or reading the respective memory cell or groups of memory cells. Various driver schemes may be used to implement a desired addressing scheme for a memory cell or for a plurality of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
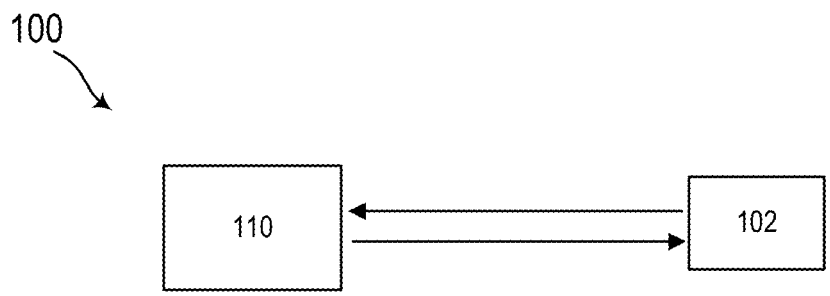
FIG. 1A schematically shows a memory cell arrangement, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g. arrangements). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "voltage" may be used herein with respect to "one or more write voltages", "one or more de-trapping voltages", "one or more gate voltages", "a base voltage", "one or more source/drain voltages", and the like. As an example, the term "gate voltage" may be used herein to denote a voltage that is provided at a gate node or a gate terminal of a transistor or a memory cell, as examples. As another example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "source/drain voltage" may be used herein to denote a voltage that is provided at a source/drain node or a source/drain terminal of a transistor or a memory cell, as examples.

A voltage provided at a node of the circuit may be defined by the respective potential applied to that node relative to the base voltage (referred to as $V_B$) of the circuit. Further, a voltage drop associated with two distinct nodes of a circuit may be defined by the respective voltages/potentials applied at the two nodes. As an example, a gate-source voltage drop associated with a gate structure (e.g. of a transistor or a memory cell) may be defined by the respective voltages/ potentials applied at the corresponding gate node and source node of the gate structure. The gate-source voltage drop may also be referred to as gate-source voltage, $V_{GS}$. In the case that the source voltage is zero, as used for example in conventional driving schemes for writing and/or reading of a field-effect transistor based memory cell, the gate-source voltage drop and the gate-source voltage, $V_{GS}$, may be referred to as gate voltage, $V_G$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g. of a voltage pulse) are considered for the comparison.

According to various aspects, a threshold voltage of a field-effect transistor or a field-effect transistor based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g. 0.1 µA. In some aspects, the constant-current threshold voltage, $V_{th(ci)}$, may be determined based on the following equation:

$$V_{th(ci)}=V_{GS} \text{ (at } I_D=I_{D0} \cdot W/L).$$

A threshold voltage of a field-effect transistor or a field-effect transistor based memory cell may be defined by the properties of the field-effect transistor or of the field-effect transistor based memory cell (e.g., the materials, the doping, etc.), and it may thus be a (e.g. intrinsic) property of the field-effect transistor or of the field-effect transistor based memory cell.

According to various aspects, a memory cell may have at least two distinct states associated therewith, for example with two distinct electrical conductivities that can be determined to determine in which of the at least two distinct states the memory cell is residing in. A field-effect transistor (FET) based memory cell (e.g., a remanent-polarizable memory cell) may include a first memory state, for example a low threshold voltage state (referred to as LVT state), and a second memory state, for example a high threshold voltage state (referred to as HVT state). The high threshold voltage state may be, in some aspects, associated with a lower current flow during readout than the low threshold voltage state. The low threshold voltage state may be an electrically conducting state (e.g., associated with a logic "1") and the high threshold voltage state may be an electrically non-conducting state or at least less conducting than the low threshold voltage state (e.g., associated with a logic "0"). However, the definition of the LVT state and the HVT state and/or the definition of a logic "0" and a logic "1" may be selected arbitrarily. Illustratively, the first memory state may be associated with a first threshold voltage of the FET based memory cell, and the second memory state may be associated with a second threshold voltage of the FET based memory cell.

According to various aspects, writing a memory cell or performing a write operation of a memory cell may include an operation or a process that modifies the memory state the memory cell is residing in from a (e.g. first) memory state to another (e.g. second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state. As an example, the programmed state may be an electrically conducting state (e.g. associated with a logic "1") and the erased state may be an electrically non-conducting state or at least less conducting than the programmed state (e.g., associated with a logic "0"). However, the definition of programmed state and erased state may be selected arbitrarily.

The term "switch" may be used herein to describe a modification of the memory state a memory cell is residing in. For example, in the case that a memory cell is residing in a first memory state (e.g., the LVT state), the memory state the memory cell is residing in may be switched such that, after the switch, the memory cell may reside in a second memory state (e.g., the HVT state), different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable layer. For example, a polarization of a remanent-polarizable layer may be switched, such that the sign of the polarization varies from positive to negative or from negative to positive, while the absolute value of the polarization may remain in some aspects substantially unaltered.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one ferroelectric field-effect transistor (FeFET). As an example, a memory cell may include a field-effect transistor structure having a ferroelectric material as a gate insulator. As another example, a memory cell may include a field-effect transistor structure and a ferroelectric capacitor structure coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. According to various aspects, a FeFET or a FeFET based memory cell may be considered as a field-effect transistor based memory cell that stores data by means of a ferroelectric material in the gate stack. According to various aspects, a non-volatile field-effect transistor based memory structure or memory cell may store data for a period of time from hours (e.g. more than 5 hours) to several tens of years (e.g. 10 years, 20 years, etc.), whereas a volatile field-effect transistor based memory structure or memory cell may store data for a period of time from nanoseconds to hours (e.g. less than 5 hours).

In comparison to other emerging memory technologies, a FeFET memory cell or a FeFET based memory cell may be integrated in the Front-End-of-Line (FEoL) and/or in the Back-End-of-Line (BEoL) process flow, since it may be implemented as a transistor-type of memory. Accordingly, the integration of the FeFET memory cell or a FeFET based memory cell may comply with a standard FEoL and/or BEoL complementary metal-oxide-semiconductor (CMOS) process flow. Consequently, various integration schemes may be used to integrate a FeFET or a FeFET based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

According to some aspects, a FeFET based memory cell may include, for example, a single FeFET structure or a plurality of FeFET structures (e.g., two FET structures). This may allow for an implementation of a ternary memory cell, e.g. a content-addressable memory (CAM) cell. A ternary memory cell may be based on one or more FeFET structures and, therefore, may be integrated together with one or more logic transistors in a CMOS process flow. The integration of one or more FeFET based memory cells on a CMOS process platform may be carried out in a gate-first process technology. However, FeFET based memory cells may be implemented into other process technologies, wherein different integration schemes may be used. The FeFET based memory cells may be integrated, for example, next to one or more logic circuit structures, e.g., next to one or more processor cores on a chip. However, the FeFET based memory cells may be integrated independently from other structures.

Various aspects may be related to a remanently-polarizable layer (also referred to as remanent-polarizable layer) as memory layer or as a functional part of a memory cell. In general, a remanent polarization (also referred to as retentivity or remanence) may be present in a material layer in the case that the material layer may remain polarized upon reduction of an applied electric field, E, to zero; therefore, a certain value for the electrical polarization, P, of the material layer may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, the terms "spontaneously polarized" or "spontaneous polarization" may be used herein, for example, with reference to the polarization capability of a material beyond dielectric polarization. The coercivity of a material may be a measure of the strength of the reverse polarizing electric field that may be required to remove a remanent polarization. According to various aspects, an electric coercive field, $E_C$, (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

According to various aspects, a ferroelectric material may be used as part of a memory cell. The term "ferroelectric" may be used herein, for example, to describe a material that shows a hysteretic charge voltage relationship (Q-V). The ferroelectric material may include ferroelectric hafnium oxide (e.g., ferroelectric $HfO_2$), ferroelectric zirconium oxide (e.g., ferroelectric $ZrO_2$), or a ferroelectric mixture of hafnium oxide and zirconium oxide, as examples. Ferroelectric hafnium oxide may include any form of hafnium oxide that may exhibit ferroelectric properties. Ferroelectric zirconium oxide may include any form of hafnium oxide that may exhibit ferroelectric properties. This may include, for example, hafnium oxide, zirconium oxide, a solid solution of hafnium oxide and zirconium oxide (e.g. but not limited to it a 1:1 mixture) or hafnium oxide and/or zirconium oxide doped or substituted with one or more of the following elements (non-exhaustive list): silicon, aluminum, gadolinium, yttrium, lanthanum, strontium, any of the rare earth elements or any other dopant (also referred to as doping agent) that is suitable to provide or maintain ferroelectricity in hafnium oxide or zirconium oxide. According to various aspects, a ferroelectric material may be an example of a material used in a remanent-polarizable layer. According to various aspects, a ferroelectric layer may be an example of a remanent-polarizable layer.

In some aspects, a memory cell arrangement (e.g., an array including a plurality of memory cells) may be operated based on one or more write operations (e.g., program and/or erase operations) and/or one or more readout operations. During a write operation, as an example, predefined voltages may be provided at a memory cell to be written (e.g., to each memory cell to be written), in some aspects the predefined voltages may be provided at electrical lines (also referred to as control-lines or driver-lines), wherein the electrical lines may be connected to the respective nodes of the memory cell(s) to allow for the desired operation. The electrical lines may be referred to, for example, as word-lines, source-lines, and/or bit-lines.

In general, a memory cell arrangement may include a plurality of (e.g. volatile or non-volatile) memory cells, which may be accessed individually or in blocks, depending on the layout of the memory cell arrangement and/or the corresponding addressing scheme. For example, in a field-effect transistor (FET) based memory cell arrangement, the memory cells may be arranged in a matrix architecture (A(n,m)) including columns, for example a number n of columns, and rows, for example a number m of rows, with n and m being integer numbers greater than one. In the matrix architecture, each memory cell may be connected to control-lines (e.g. to one or more word-lines, to a bit-line, and to a source-line), which may be used to supply voltages to the memory cells for performing write operations and readout operations. The matrix architecture may be, for example, referred to as "NOR" or "NAND" architecture, depending on the way neighboring memory cells are connected to each other, i.e. depending on the way the terminals of neighboring memory cells are shared, but are not limited to these two types (another type is for example an "AND"

architecture). For example, in a NAND architecture the memory cells may be organized in sectors (also referred to as blocks) of memory cells, wherein the memory cells are serially connected in a string (e.g. source and drain regions are shared by neighboring transistors), and the string is connected to a bit-line and a source-line. For example, groups of memory cells in a NAND architecture may be connected in series with one another. In a NOR architecture the memory cells may be connected in parallel with one another, for example each memory cell of a column may be connected to a different source-line and may share the same bit-line with the one or more other memory cells in the same column. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more FET based memory cells. In some aspects, a control circuit may be configured to carry out and/or instruct one or more write operations associated with a writing of one or more memory cells of the memory cell arrangement. In some aspects, a control circuit may be used to control a writing of a single memory cell of the memory cell arrangement. In some aspects, a control circuit may be used to control a writing of all the memory cells in a same row of memory cells (e.g., all memory cells having a node connected to a common control line, for example to a common word-line). According to various aspects, writing a memory cell may include bringing the memory cell from one of at least two memory states into another one of the at least two memory states of the memory cell (e.g., from the LVT state into the HVT state, or vice versa).

A possible issue may be that electrical charges may remain trapped in a memory cell (e.g., in a memory element of the memory cell) during or after writing of the memory cell. For example, this phenomenon may be referred to as trapping or charge trapping. The trapped charges may affect the memory state the memory cell is (or should be) residing in. The trapped charges may have the effect that the memory state the memory cell is residing in after writing may not be unambiguously identifiable. Illustratively, the trapped charges may cause a screening of the memory state the memory cell is residing in, e.g. the trapped charges may be seen as screening charges influencing one or more electrical properties of the memory cell. As an example, in case a memory cell is switched into an electrically conducting state, the charges trapped in the memory cell may reduce its conductivity (e.g., the conductivity of a channel of a FET structure) such that a readout operation may not unambiguously show that the memory cell is in the conducting state, or a readout operation may even show that the memory cell is in a non-conducting state in case a high number of charges remained trapped. As another example, in case a memory cell is switched into an electrically non-conducting state, the charges trapped in the memory cell may increase its conductivity (e.g., the conductivity of the channel) such that a readout operation may not unambiguously show that the memory cell is in the non-conducting state, or a readout operation may even show that the memory cell is in a conducting state in case a high number of charges remained trapped. This may lead to incorrect data storage and/or to fails during readout.

Various aspects are related to a control circuit that is configured to efficiently carry out write operations based on a smart de-trapping writing scheme (referred to in the following as de-trapping writing scheme or de-trapping scheme for brevity). The de-trapping writing scheme may illustratively include providing various voltages at the memory cell(s) intended to be written in such a way that any charge trapping-related effects may be substantially removed during writing, e.g. during bringing the memory cell(s) into a (new) memory state. In various aspects, the de-trapping writing scheme may include providing various voltages at the memory cell(s) in such a way that the memory cell(s) may be substantially free of trapped electrical charges, e.g. in such a way that electrical charges trapped in the memory cell may be removed during the write operation. The de-trapping writing scheme may illustratively include a de-trapping and verifying sequence following one or more write voltage pulses provided at a memory cell, during which the memory state of the memory cell is determined after each de-trapping voltage pulse or each group of one or more de-trapping voltage pulses.

In some aspects, the verifying of the memory state of the memory cell may (e.g., additionally) be carried out after each write voltage pulse or each sequence of write voltage pulses, as described in further detail below. This optional verifying operation may be provided to determine whether the de-trapping is to be performed or not.

According to various aspects, a de-trapping writing scheme for writing a memory cell into a memory state may include providing one or more write voltage pulses and one or more de-trapping voltage pulses at the memory cell. The one or more de-trapping voltage pulses may have opposite polarity with respect to the one or more write voltage pulses. The one or more de-trapping voltage pulses may be configured such that by means of the one or more de-trapping voltage pulses the electrical charges trapped into the memory cell may be substantially removed (e.g., released from the memory cell).

According to various aspects, a de-trapping writing scheme for writing a memory cell into a memory state may include providing one or more write voltage pulses at the memory cell, providing one or more de-trapping voltage pulses at the memory cell, checking whether the memory cell is in the memory state and, in case the memory cell is not in the memory state, providing one or more additional de-trapping voltage pulses at the memory cell.

According to various aspects, a de-trapping writing scheme for writing a memory cell into a memory state may include providing one or more write voltage pulses at the memory cell, the one or more write voltage pulses having a first polarity. The de-trapping writing scheme may further include providing one or more de-trapping voltage pulses at the memory cell, the one or more de-trapping voltage pulses having a second polarity opposite the first polarity. The de-trapping writing scheme may further include checking (e.g., verifying) whether (or not) the memory cell is in the memory state and, in the case that the memory cell is not in the memory state, providing one or more additional de-trapping voltage pulses at the memory cell, the one or more additional de-trapping voltage pulses having the second polarity. The one or more additional de-trapping voltage pulses are distinct from the one or more de-trapping voltage pulses with respect to at least one of the following: a pulse height of the one or more additional de-trapping voltage pulses is different from a pulse height of the one or more de-trapping voltage pulses, a pulse width of the one or more additional de-trapping voltage pulses is different from a pulse width of the one or more de-trapping voltage pulses, a total on-time of the one or more additional de-trapping voltage pulses is different from a total on time of the one or more de-trapping voltage pulses, and/or a number of the one or more additional de-trapping voltage pulses is different from a number of the one or more de-trapping voltage pulses.

According to various aspects, a memory cell arrangement may include a control circuit configured to provide one or more write voltage pulses and one or more de-trapping voltage pulses to at least one memory cell of the memory cell arrangement. Illustratively, the memory cell arrangement may include one or more memory cells, wherein at least one memory cell of the memory cell arrangement is intended to be written by application of the one or more write voltage pulses and the one or more de-trapping voltage pulses. In some aspects, a single memory cell of the memory cell arrangement may be written and "de-trapped" by application of the one or more write voltage pulses and the one or more de-trapping voltage pulses. In some other aspects, a plurality of memory cells of the memory cell arrangement may be written and "de-trapped" (illustratively at the same time) by application of common one or more write voltage pulses and common one or more de-trapping voltage pulses.

According to various aspects, a memory cell arrangement may include a control circuit configured to carry out a write operation to write at least one memory cell of the memory cell arrangement into a memory state. The at least one memory cell may include a field-effect transistor structure and a memory element integrated in the field-effect transistor structure. The write operation may include: providing one or more write voltage pulses at the at least one memory cell, the one or more write voltage pulses having a first polarity; providing one or more de-trapping voltage pulses at the at least one memory cell, the one or more de-trapping voltage pulses having a second polarity opposite the first polarity; checking whether (or not) the at least one memory cell is in the memory state and, in the case that the at least one memory cell is not in the memory state, providing one or more additional de-trapping voltage pulses at the at least one memory cell. The one or more additional de-trapping voltage pulses are distinct from the one or more de-trapping voltage pulses with respect to at least one of the following: a pulse height of the one or more additional de-trapping voltage pulses is different from a pulse height of the one or more de-trapping voltage pulses, a pulse width of the one or more additional de-trapping voltage pulses is different from a pulse width of the one or more de-trapping voltage pulses, a total on-time of the one or more additional de-trapping voltage pulses is different from a total on time of the one or more de-trapping voltage pulses, and/or a number of the one or more additional de-trapping voltage pulses is different from a number of the one or more de-trapping voltage pulses.

FIG. 1A illustrates schematically a memory cell arrangement 100, according to various aspects. The memory cell arrangement 100 may include one or more memory cells 102. In the following, and in FIG. 1A, a single memory cell 102 is described or illustrated. It is however understood that the memory cell arrangement 100 may include any number of memory cells 102, for example disposed in a matrix arrangement (e.g., in a number, n, of columns and in a number, m, of rows, with m and n integer numbers greater than 1). It is also understood that the properties and the operations described herein with reference to (at least) one memory cell 102 may correspondingly apply to a plurality of memory cells, e.g. to each memory cell of the memory cell arrangement 100. An exemplary realization of a memory cell (e.g., of the memory cell 102) will be described in further detail below, for example in relation to FIG. 1B.

According to various aspects, a memory cell 102 may be configured to reside in one of at least two memory states associated with the memory cell 102. The memory state a memory cell 102 is residing in may be associated with one of at least two threshold voltages (e.g. a first threshold voltage, $V_{L-th}$, and a second threshold voltage, $V_{H-th}$) of the memory cell 102 (e.g. of a field-effect transistor structure of the memory cell 102, see also FIG. 1B). According to various aspects, the at least two memory states may include a first memory state (e.g. a LVT state) and a second memory state (e.g. a HVT state). Illustratively, a memory cell 102 may have a first (e.g. low) threshold voltage, $V_{L-th}$, in the first memory state, and a second (e.g. high) threshold voltage, $V_{H-th}$, in the second memory state. The first threshold voltage, $V_{L-th}$, may be different (e.g. lower or higher) from the second threshold voltage, $V_{H-th}$.

Figure 1B:
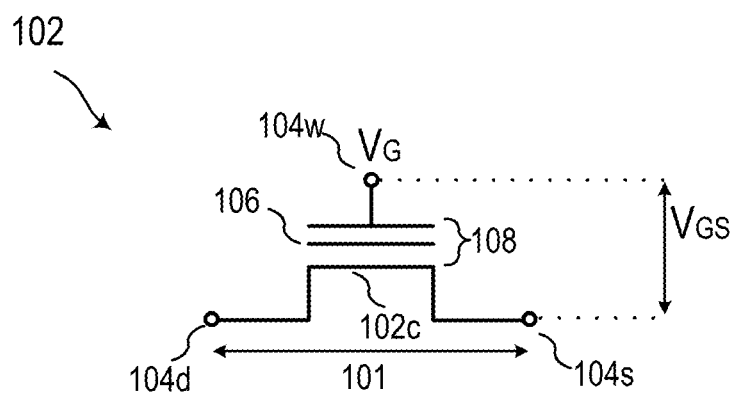
FIG. 1B schematically shows a memory cell, according to various aspects.

According to various aspects, a memory element of a memory cell 102 may include one or more remanent-polarizable layers (as an example, a memory cell 102 may be a FeFET or a FeFET based memory cell), see also FIG. 1B. In this case, the memory state the memory cell 102 is residing in may be associated with one of at least two polarization states of the one or more remanent-polarizable layers. The first threshold voltage, $V_{L-th}$, may be associated with a first (e.g., positive) residual polarization of the remanent-polarizable layer (e.g., it may be a function of the first residual polarization). The second threshold voltage, $V_{H-th}$, may be associated with a second (e.g., negative) residual polarization of the remanent-polarizable layer (e.g., it may be a function of the second residual polarization).

The memory cell arrangement 100 may include a control circuit 110 configured to carry out and/or instruct one or more write operations associated with a writing of a memory cell 102 of the memory cell arrangement 100. In some aspects, the control circuit 110 may be configured to carry out a write operation to write at least one memory cell 102 of the memory cell arrangement 100 into a memory state (e.g., to switch the memory state the memory cell 102 is residing in, e.g. from the first memory state to the second memory state or vice versa). The control circuit 110 may be configured to supply one or more write voltage pulses and one or more de-trapping voltage pulses to the memory cell 102. As an example, the control circuit 110 may include or may control one or more voltage supply circuits. The one or more voltage supply circuits may be used for supplying control voltages (e.g. write voltage pulses and de-trapping voltage pulses) to the memory cell 102, e.g. to respective control nodes of the memory cell 102 (for example via control-lines of the memory cell arrangement 100, such as word-lines, bit-lines, and source-lines). According to various aspects, the control circuit 110 may define a base voltage, $V_B$, e.g. a ground voltage (for example 0 V) associated with the memory cell arrangement 100. In some aspects, the base voltage, $V_B$, may be a low voltage, VSS, of the circuit. The write operation will be described in further detail below, for example in relation to FIG. 2A to FIG. 3H.

According to various aspects, the control circuit 110 may be configured to carry out and/or instruct one or more readout operations associated with a readout of a memory cell 102 of the memory cell arrangement 100, e.g. to determine a memory state the memory cell 102 (or a group of memory cells 102) is residing in. One or more readout voltages may be provided at a memory cell 102, and the memory state the memory cell 102 is residing in may be determined based on the value of a current outputted by the memory cell 102. In some aspects, the current outputted by the memory cell 102 may be a drain current, $I_D$, or a source current, Is, of a field-effect transistor structure of the memory cell 102. In some aspects, the current outputted by the memory cell 102 may be a source/drain current, $I_{SD}$, of a field-effect transistor structure of the memory cell 102.

As an example, in the case that the memory cell 102 is residing in a first memory state, for example in a conducting state of the memory cell 102, a current value above a reference value may be detected, for example associated with a logic "1". In the case that the memory cell is residing in a second memory state, for example in a non-conducting state of the memory cell 102, a current value below the reference value may be detected, for example associated with a logic "0". The reference value may be, for example, a reference current value or a reference voltage value. In some aspects the reference value may be the value of a reference current of a sense amplifier used for detecting a drain current, $I_D$. In some aspects, the current outputted by the memory cell 102 (e.g., by a field-effect transistor structure thereof) may be transformed into a voltage and a corresponding voltage value may be compared with a reference voltage value.

FIG. 1B illustrates an exemplary configuration of a memory cell 102 in a schematic view, according to various aspects. The memory cell 102 may include a field-effect transistor structure. The memory cell 102 may be configured as a field-effect transistor based memory cell, wherein one or more electronic properties of a field-effect transistor structure (e.g., a conductivity of a channel between two source/drain regions) may be influenced by a memory element 106 (e.g., by a polarized remanent-polarizable material, a charged layer, a phase change material etc.) of the memory cell 102. It is understood that the schematic configuration illustrated in FIG. 1B is only an example, and that the de-trapping scheme described herein may be applicable to any type of memory cell, e.g. any type of memory cell in which trapping of electrical charges may influence electrical properties (e.g., a memory state) of the memory cell.

The field-effect transistor function may be provided by any suitable design, e.g., via a channel 102c, a first source/drain region, a second source/drain region, and a gate structure 108 disposed adjacent to the channel 102c. The channel 102c may be provided by one or more semiconductor portions, e.g., within a bulk region of semiconductor substrate or within a semiconductor layer, only as examples. The channel 102c may be disposed between at least a first source/drain region and a second source/drain region. The channel 102c and the source/drain regions may be formed, e.g., via doping one or more semiconductor materials or by the use of intrinsically doped semiconductor materials, within a layer and/or over a layer.

In various aspects, an electrical current flow 101 between the first source/drain region and the second source/drain region, e.g. a current flow 101 between a source node 104s and a drain node 104d of the memory cell 102, may be controlled by controlling a gate voltage, $V_G$, which is applied at a gate node 104g of the memory cell 102. The gate node 104g may be electrically connected to the gate structure 108 of the memory cell 102.

In various aspects, the gate structure 108 may be configured to allow for a control of one or more electrical properties (e.g., an electrical resistance, e.g., a charge carrier density, e.g., a source/drain current through the channel in the case that a voltage is applied between the two source/drain regions only as examples) of the channel 102c. Illustratively, the gate structure 108 may be configured to allow for a selective switching of the field-effect transistor into at least two different states (e.g., on and off). The gate structure 108 may include at least a gate isolation and a gate electrode, according to various aspects. The gate-isolation and the gate electrode may be configured to provide an electric field in the channel 102c and/or to modify an electric field that is present in the channel 102c. The electric field that is provided/present in the channel 102c may define the one or more electrical properties of the channel 102c. In some aspects, the gate electrode may include or may consist of one or more electrically conductive layers. The one or more electrically conductive layers may include polysilicon, amorphous silicon, a metal (e.g. TiN, TaN) only as examples. In some aspects, the gate-isolation may include or may consist of one or more electrically insulating layers. The one or more electrically insulating layers may include or may consist of $SiO_2$, SiON, and/or SiN, only as examples.

In various aspects, the memory cell 102 may include a memory element 106 integrated in the field-effect transistor structure. The memory element 106 may be, for example, part of the gate structure 108 or connected to the gate structure 108. The memory element 106 may be disposed between the channel region 102c and a gate electrode of the field-effect transistor structure. In some aspects, the gate-isolation may include or may consist of one or more memory elements to implement a memory function. The one or more memory elements may be configured to modify the one or more electrical properties (e.g., the electrical resistance, e.g., the charge carrier density, e.g., the source/drain current through the channel) of the channel 102c as a function of at least two memory states of the one or more memory elements. The memory element 106 may be configured such that at least one electrical property (e.g., a charge state, a polarization, a conductivity, etc.) of the memory element 106 can be changed persistently. According to various aspects, the memory element 106 and the gate structure 108 may be configured to allow for a persistent change of the threshold voltage, $V_{th}$, of the memory cell 102 as a function of the state of the memory element 106. Accordingly, the memory cell 102 may have at least a first memory state (e.g., the LVT memory state) and a second memory state (e.g., the HVT memory state) defined by the state of the memory element 106.

In various aspects, a voltage provided at a memory cell 102 may be understood as a voltage provided to at least one of the gate node 104g and a source/drain node 104s, 104d of the memory cell 102 while keeping the other one of the gate node 104g and a source/drain node 104s, 104d at a base voltage, $V_B$, (e.g., at the base voltage of the memory cell arrangement 100). Illustratively, a voltage (e.g., a write voltage and/or a de-trapping voltage) provided at a memory cell 102 may include a first voltage supplied to the gate node gate node 104g of the memory cell 102 and a second voltage supplied to one of the source node 104s or drain node 104d of the memory cell 102. One of the first voltage or the second voltage may be substantially equal to the base voltage, $V_B$ (e.g. in a range from about −0.25 V to about +0.25 V in the case that the base voltage, $V_B$, is 0 V). In various aspects, a control circuit (e.g., the control circuit 110) may be configured such that either the gate node 104g or at least one source/drain node 104s, 104d associated with the memory cell 102 is maintained at the base potential while the write voltage and/or the de-trapping voltage is supplied to the memory cell 102. According to various aspects, a voltage provided at the memory cell 102 may be understood as any (e.g., constant or time-varying) potential or voltage at the gate node 104g and at least one source/drain node 104s, 104d corresponding to the memory cell 102 defining a voltage drop over the memory element 106 of the memory cell 102.

As an example, the memory element 106 may include a floating gate, which may be in a first state when negative charges (electrons) are stored in the floating gate, and may be in a second state when the floating gate is uncharged. When negative charges are stored in the floating gate, a higher gate-source voltage, $V_{GS}$, is required to enable the current flow between the source and drain terminals 104s, 104d of the memory cell 102, as compared to when the floating gate is uncharged. In this case, the memory cell 102 may have a higher threshold voltage. Thus, switching the state of the floating gate from a charged state to an uncharged state, and vice versa, may allow switching the threshold voltage state of the memory cell 102, and accordingly a logic state associated therewith.

In various aspects, the memory element 106 may include one or more remanent-polarizable layers. The gate node 104g may be connected to at least one of the gate structure 108 and the one or more remanent-polarizable layers. The one or more remanent-polarizable layers may have two stable polarization states. The respective polarization state may be defined by a residual polarization of the one or more remanent-polarizable layers. According to various aspects, the memory cell 102 may reside in a first memory state in the case that the one or more remanent-polarizable layers are in a first polarization state, and the memory cell 102 may reside in a second memory state in the case that the one or more remanent-polarizable layers are in a second polarization state (e.g., opposite to the first polarization state).

According to various aspects, the residual polarization may cause an aggregation of positive charges or negative charges in the surrounding of the one or more remanent-polarizable layers, for example in an electrode or in an underlying stack formed by an insulating layer and a semiconductor substrate. The accumulation of charges may be used to change the conductivity of a channel of a field-effect transistor structure (e.g., of the channel 102c), thus changing the threshold voltage of a memory cell. In some aspects, writing a memory cell 102 into a memory state may include switching a polarization state of the one or more remanent-polarizable layers (e.g., from a positive polarization state to a negative polarization state, or vice versa). Illustratively, writing a memory cell 102 into a memory state may include changing the sign of a residual polarization of the one or more remanent-polarizable layers.

According to various aspects, the at least two threshold voltages of a memory cell (e.g., of the field effect transistor structure of the memory cell) may be a function of the residual polarization of the one or more remanent-polarizable layers. Switching the state of the one or more remanent-polarizable layers from a first (e.g., positive) polarization state to a second (e.g., negative) polarization state, and vice versa, may thus allow switching the threshold voltage state of the memory cell, and accordingly a logic state associated therewith. According to various aspects, the at least two threshold voltages of a memory cell may be a function of the coercive field of the one or more remanent-polarizable layers. The coercive field may be or may represent the field required to depolarize the one or more remanent-polarizable layers.

The one or more remanent-polarizable layers may include or may consist of a remanent-polarizable material, e.g., ferroelectric $HfO_2$, e.g., ferroelectric $ZrO_2$, only as examples. It may be noted that, in the case that a remanent-polarizable layer is included in a gate-isolation structure of a field-effect transistor based memory cell, the memory cell may be referred to as FeFET-(ferroelectric field-effect transistor)-based memory cell (also referred to as FeFET cell or—in short form—as FeFET). A gate structure 108 of a FeFET together with the channel 102c and/or a portion of the semiconductor bulk region including the channel 102c may be also referred to as FeFET stack.

Figure 1C:
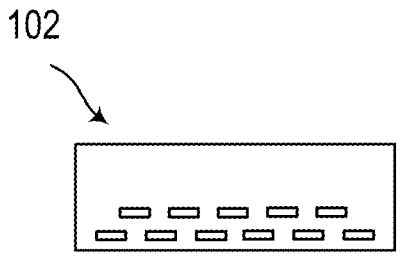
FIG. 1C and FIG. 1D each shows schematically charges trapped in a memory cell, according to various aspects.
Figure 1D:
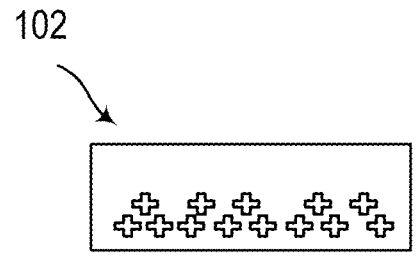

As illustrated in FIG. 1C and FIG. 1D, electrical charges may remain trapped in a memory cell, e.g. in the memory cell 102, during or after a writing of the memory cell. The charges, (e.g., electrons, represented by the symbol "−" in FIG. 1C, or holes, represented by the symbol "+" in FIG. 1D) may remain trapped, for example, in the memory element of a memory cell, e.g. in the memory element 106. Illustratively, the writing of a memory cell may intend to switch the type of charges that are included or surround a memory element of a memory cell, e.g., from positive to negative or vice versa. However, electrical charges of the opposite type may not be completely removed from the memory cell (e.g., from the memory element), e.g. may remain trapped in the memory cell despite the provided voltages. As a result, the memory state of the memory cell may not be fully switched, i.e. the trapped charges may counteract the switching of the state of the memory cell (e.g., of the state of the memory element). Stated in a different fashion, the trapped charges may (fully or partially) screen the (intended or target) memory state of the memory cell.

Only as an example, in case the memory element of a memory cell includes one or more remanent-polarizable layers, the one or more remanent-polarizable layers may be switched into a polarization state intended to attract charges of one type to the channel of a field-effect transistor structure of a memory cell. However, the presence of charges trapped in the one or more remanent-polarizable layers may counteract or even prevent said attraction of charges, thus preventing (fully or partially) the switch of the electrical properties of the channel (e.g., the switch of the conductivity of the channel).

The "de-trapping" scheme described herein may ensure that substantially no "unintended" charges remain trapped in a memory cell (e.g., in a memory element). This may ensure that a memory cell is capable of storing a memory state in a correct manner. The "de-trapping" scheme described herein may thus reduce or substantially eliminate read fails. A write operation according to the de-trapping scheme is described in further detail below, for example with reference to FIG. 2A to FIG. 3H. The write operation described in relation to FIG. 2A to FIG. 3H may be a write operation that the control circuit of a memory cell arrangement (e.g., the control circuit 110 of the memory cell arrangement 100) is configured to carry out and/or instruct. Illustratively, the diagrams 200a, 200b, 200c, 200d, 200e, 200f, 200g, 200h, 200i, 200j, 200k, 300a, 300b, 300c, 300d, 300e, 300f, 300g, 300h in FIG. 2A to FIG. 3H show possible write voltage pulses and de-trapping voltage pulses that may be provided at a memory cell, e.g. at the memory cell 102. It is understood that there may be numerous possibilities for providing the write voltage pulses and de-trapping voltage pulses, e.g. various possible permutations of the properties described in further detail below, and therefore the FIG. 2A to FIG. 3H are to be interpreted as non-limiting examples, and other combinations may be possible.

According to various aspects, one or more voltage pulses (e.g., one or more write voltage pulses or one or more de-trapping voltage pulses) may include a number of voltage pulses. Only as a numerical example, the number of voltage pulses of one or more (e.g., write or de-trapping) voltage pulses may be in the range from 1 to 10000, e.g. in the range from 1 to 1000, e.g. in the range from 1 to 100.

According to various aspects, a voltage pulse (e.g., a write voltage pulse and/or a de-trapping voltage pulse) may have an amplitude (also referred to as pulse height for a pulsed voltage). The amplitude may be or may represent a maximum voltage value (or voltage level) associated with the voltage pulse. In other words, the amplitude may be or may represent the magnitude of a voltage level (e.g., a write voltage or a de-trapping voltage) associated with the voltage pulse. Illustratively, the amplitude may be or may represent a voltage level associated with the voltage pulse evaluated with respect to a reference voltage, $V_{ref}$, e.g. a base voltage, $V_B$, of a memory cell arrangement. The amplitude may also be referred to as peak amplitude. Only as a numerical example, the pulse height of a (e.g., write or de-trapping) voltage pulse may be in the range from about 1 V to about 10 V, e.g. from about 2 V to about 5 V, e.g. 4 V.

In some aspects, each voltage pulse of one or more voltage pulses may have the same pulse height. In some other aspects, a voltage pulse of one or more voltage pulses may have a pulse height not necessarily equal to the pulse height of the other voltage pulses of the one or more voltage pulses (in case of a plurality of voltage pulses), e.g. a voltage pulse of the one or more voltage pulses may have a pulse height different from the pulse height of at least another one of the one or more voltage pulses.

According to various aspects, a voltage pulse (e.g., a write voltage pulse and/or a de-trapping voltage pulse) may have a pulse width (also referred to as pulse length or duration). The pulse width may be, in some aspects, determined as so called full width at half maximum (FWHM) of a pulse. In various aspects, one or more voltage pulses may have a total on-time, e.g. a total time in which the one or more pulses may have a non-zero amplitude. In some aspects, a total on-time of (or associated with) one or more voltage pulses may be understood as a sum of the (individual) pulse widths of the one or more pulses. A total on-time may coincide with a pulse width of the one or more voltage pulses in case the one or more voltage pulses include a single pulse. Only as a numerical example, the (individual) pulse width of a (e.g., write or de-trapping) voltage pulse may be in the range from about 1 ns to about 100 ns, e.g. in the range from about 5 ns to about 20 ns, e.g. about 10 ns. Only as a numerical example, a total on-time of one or more (e.g., write or de-trapping) voltage pulse may be in the range from about 1 ns to about 100 ms, e.g. in the range from about 10 ns to about 10 ms.

In some aspects, each voltage pulse of one or more voltage pulses may have the same pulse width. In some other aspects, a voltage pulse of one or more voltage pulses may have a pulse width not necessarily equal to the pulse width of other voltage pulses of the one or more voltage pulses (in case of a plurality of voltage pulses), e.g. a voltage pulse of the one or more voltage pulses may have a pulse width different from the pulse width of at least another one of the one or more voltage pulses.

The total on-time of one or more voltage pulses may be different (e.g., greater or smaller) from the total on-time of one or more other voltage pulses, for example, in case the number of pulses is the same but the one or more voltage pulses have different (e.g., greater or smaller) pulse width with respect to the one or more other voltage pulses. As another example, the total on-time of one or more voltage pulses may be different from the total on-time of one or more other voltage pulses in case the pulse widths are equal but the number of pulses of the one or more voltage pulses is different (e.g., greater or smaller) with respect to the number of pulses of the one or more other voltage pulses. As a further example, the total on-time of one or more voltage pulses may be different from the total on-time of one or more other voltage pulses in case both the pulse width(s) and the number of pulses of the one or more voltage pulses are different from the pulse width(s) and the number of pulses of the one or more other voltage pulses.

According to various aspects, a voltage pulse (e.g., a write voltage pulse and/or a de-trapping voltage pulse) may have a polarity, e.g. a positive polarity or a negative polarity. The polarity of a voltage pulse may be understood as a sign of the amplitude of the voltage pulse, e.g. with respect to the reference voltage, $V_{ref}$. The polarity of a voltage pulse may be selected depending on the intended operation (e.g., on the memory state to be written) and/or depending on the type of memory cell (e.g., on the type of field-effect transistor structure). The polarity of a voltage pulse may be selected, in some aspects, to provide a desired polarity of a voltage drop across a memory element of the memory cell, e.g. a desired polarity of a gate-source voltage drop $V_{GS}$. In the following, voltage pulses (e.g., write voltage pulses and de-trapping voltage pulses) provided at a memory cell are described. In some aspects, providing a voltage pulse at a memory cell may be understood as providing a corresponding voltage drop across the memory element of the memory cell (e.g., in case the voltage pulse is provided at the gate node of the memory cell and the reference voltage, $V_{ref}$, is provided at the source node of the memory cell). As an example, a voltage drop having a positive polarity may be provided by providing a positive voltage pulse at the gate node and the reference voltage, $V_{ref}$, at the source node, or by providing a negative voltage pulse at the source node and the reference voltage, $V_{ref}$, at the gate node. As another example, a voltage drop having a negative polarity may be provided by providing a negative voltage pulse at the gate node and the reference voltage, $V_{ref}$, at the source node, or by providing a positive voltage pulse at the source node and the reference voltage, $V_{ref}$, at the gate node.

By way of example, in case a memory cell is an n-type FET based memory cell, a voltage drop to write the memory cell into the LVT state may have a positive polarity (e.g., a positive voltage may be provided at a gate node of the memory cell and the reference voltage may be provided at a source node of the memory cell). As another example, in case a memory cell is an n-type FET based memory cell, a voltage drop to write the memory cell into the HVT state may have a negative polarity (e.g., a negative voltage may be provided at a gate node of the memory cell and the base voltage may be provided at a source node of the memory cell). In case of a p-type FET based memory cell the voltage drop to write the memory cell into the LVT state may have a negative polarity, and the voltage drop to write the memory cell into the HVT state may have a positive polarity.

According to various aspects, a voltage pulse (e.g., a write voltage pulse and/or a de-trapping voltage pulse) may have a rise time. The rise time may be or may represent the amount of time the voltage pulse takes to go from the reference voltage, $V_{ref}$, to the desired (e.g., write or de-trapping) voltage, e.g. to the desired amplitude. As a numerical example, the rise time of a voltage pulse (e.g., of a write voltage pulse and/or of a de-trapping voltage pulse) may be in the range from about 1 ns to about 100 ns, for example from about 5 ns to about 50 ns. According to various aspects, a voltage pulse (e.g., a write voltage pulse and/or a de-trapping voltage pulse) may have a fall time. The fall time may be or may represent the amount of time the voltage pulse takes to go from its (e.g., write or de-trapping) voltage level to the reference voltage, $V_{ref}$. As a numerical example, the fall time of a voltage pulse (e.g., of a write voltage pulse and/or of a de-trapping voltage pulse) may be in the range from about 1 ns to about 100 ns, for example from about 5 ns to about 50 ns. In the FIG. 2A to FIG. 3H the voltage pulses are illustrated as having instantaneous rise and fall, e.g. as having negligible rise time and/or negligible fall time (e.g., negligible with respect to a pulse duration of the pulses), it is however understood that a rise time and/or a fall time may, in some aspects, be present.

The write operation may include providing one or more write voltage pulses and one or more de-trapping voltage pulses until the memory cell to be written is in the (target) memory state. One or more properties of the one or more write voltage pulses and of the one or more de-trapping voltage pulses may be iteratively modified (e.g., at least one of a pulse height, a pulse width, a total on-time, and/or a number of pulses may be iteratively increased) until the target memory state is reached (e.g., until a current outputted by the memory cell reaches a target value). The iteration may continue until the target memory state is reached or until respective threshold values (also referred to herein as threshold levels or thresholds) for the modifiable properties are reached. As an example the pulse height of one or more (e.g., write or de-trapping) voltage pulses may be iteratively increased up to a threshold pulse height (e.g., 5 V or 10 V), which may be defined in some aspects by the properties of the memory cell (e.g., by a coercive field of a remanent-polarizable layer of the memory cell). As another example, the pulse width (and/or the total on-time) of one or more (e.g., write or de-trapping) voltage pulses may be iteratively increased up to a threshold pulse width and/or a threshold total on-time (e.g., 100 ns or 500 ns for an individual pulse width, e.g. 10 ms, 50 ms, or 100 ms for a total on-time). The threshold for the pulse width and/or for the total on-time may be defined by a maximum allowable duration for a write operation. As a further example, the number of pulses of one or more (e.g., write or de-trapping) voltage pulses may be iteratively increased up to a threshold number of pulses (e.g., 1000 pulses or 10000 pulses). The threshold number of pulses may be defined by the maximum allowable duration for a write operation, e.g. taking into consideration the pulse width and the total on-time.

By way of illustration, in case a memory cell is to be written (e.g., programmed or erased), a (small) voltage is applied at the memory cell. Direct after this voltage pulse, a de-trapping pulse with an opposite voltage (e.g., much smaller than a coercive voltage) may be applied with various pulse duration and various pulse amplitude. After each de-trapping pulse, a current read on the target threshold voltage may be performed. In case the current reaches a threshold current criterion (e.g., in case a comparison with a reference value indicates that the target memory state has been reached), no further pulses will be applied to the memory cell. Otherwise, the operation may continue with longer de-trapping pulses or larger de-trapping pulses. In case, after applying the longest and largest de-trapping pulse, still no threshold is reached, a slightly increase write voltage (e.g., a slightly increased programming voltage) may be applied to the memory cell. Directly after this, the same de-trapping procedure may continue. In this manner, it may be possible to achieve the target threshold voltage with the smallest charge trapping. This may contribute to the endurance performance, e.g. to improving the endurance behavior of the memory cell.

A write operation may illustratively include one or more write portions or write periods and (if necessary) one or more de-trapping portions or de-trapping periods. The write periods are denoted as Tw in the FIG. 2A to FIG. 3H. The de-trapping periods are denoted as TD in the FIG. 2A to FIG. 3H. A write portion may include providing one or more write voltage pulses at a memory cell, e.g. a write portion may be dedicated to switching the memory state of the memory cell. A de-trapping period may include providing one or more de-trapping voltage pulses at the memory cell (e.g., in case the memory cell is not in the target memory state), e.g. a de-trapping period may be dedicated to de-trapping charges from the memory cell. In some aspects, there may be no de-trapping voltage pulses provided during a write period, e.g. any write voltage pulse provided during a same write period may be (or may be considered as) part of a same write sequence, e.g. part of same one or more write voltage pulses. In some aspects, there may be no write voltage pulses provided during a de-trapping period, e.g. any de-trapping voltage pulse provided during a same de-trapping period may be (or may be considered as) part of a same de-trapping sequence, e.g. part of same one or more de-trapping voltage pulses.

In some aspects, a de-trapping period may be a period between subsequent write periods (e.g., between subsequent, different, write voltage pulses). Illustratively, after an attempt of writing the memory cell into the memory state, de-trapping voltage pulses may be provided at the memory cell (during the de-trapping period) to release the trapped charges. Within a de-trapping period one or more properties of the de-trapping voltage pulses may be varied until the memory cell is in the memory state or until the respective threshold levels are reached. In case the de-trapping does not succeed, e.g. in case the memory cell is not into the memory state before the properties of the de-trapping voltage pulses reach the threshold level(s) described above, a new write period may start. In the new write period, new one or more write voltage pulses may be provided at the memory cell, e.g. with modified one or more properties with respect to the one or more voltage pulses provided in the previous write period. Following the new one or more write voltage pulses, a new de-trapping period may start, in case the memory cell is not into the memory state. In the new de-trapping period the same or different de-trapping voltage pulses with respect to the previous de-trapping period may be provided at the memory cell.

The iteration may stop as soon as it is determined that the memory cell is in the target memory state. Alternatively, the iteration may stop in case the properties of the write voltage pulses and the properties of the de-trapping voltage pulses have reached the threshold levels described above. In this case, a write error may be generated. The write operation according to the iterative de-trapping scheme described herein is illustrated, for example, in FIG. 4. Exemplary realizations of the write operation according to the iterative de-trapping scheme are described in further detail in relation to FIG. 2A to FIG. 3H.

The write operation may include (e.g., in a first write period, Tw) providing one or more first voltage pulses 202w at a memory cell (e.g., to at least one memory cell of a memory cell arrangement, e.g. to the at least one memory cell 102 of the memory cell arrangement 100). The one or more first voltage pulses 202w may be, for example, one or more write voltage pulses, e.g. the one or more first voltage 202w pulses may be configured (or at least intended) to switch the memory state the memory cell is residing in. The one or more first voltage pulses 202w may have a first pulse height, $H_1$, a first pulse width, $W_1$, and a first polarity (e.g., a positive polarity as shown, for example, in FIG. 2A to FIG. 2C, or a negative polarity as shown, for example, in FIG. 2D to FIG. 2F). The one or more first voltage pulses 202w may include a single voltage pulse or a plurality (e.g., a sequence) of voltage pulses, as described in further detail below. In some aspects, the one or more first voltage pulses 202w may include a first number of voltage pulses.

In some aspects, it may be assumed that the memory cell may have charges trapped therein, and that the memory cell does not (fully) reside in the target memory state. Accordingly, de-trapping voltage pulses may be provided at the memory cell without checking whether the memory cell is residing in the (target) memory state. In some aspects, after providing the one or more first voltage pulses 202w, the write operation may include checking whether the memory cell is in the memory state.

Checking whether the memory cell is in the memory state may include checking whether one or more properties of the memory cell correspond to the properties that the memory cell should have in case it was residing in the memory state. As an example, checking whether the memory cell is in the memory state may include checking one or more electrical properties (e.g., a conductivity, a resistivity, etc.) of a channel of a field-effect transistor structure of the memory cell. In some aspects, checking whether the memory cell is in the memory state may include a readout of the memory state of the memory cell, e.g. it may include determining a current outputted by the memory cell (e.g., a drain current or a source/drain current). The value of the current outputted by the memory cell may be compared with a reference value (e.g., a reference current value or a reference voltage value, as described above). Depending on the result of the comparison it may be determined whether the memory cell resides in the memory state. The reference value may be, for example, a current value that should be outputted by the memory cell in case it was residing in the memory state. As an example, in case the value of the current outputted by the memory cell substantially corresponds to the reference value it may be determined that the memory cell resides in the memory state. As another example, it may be determined that the memory cell resides in the memory state in case the value of the current outputted by the memory cell is below the reference value (e.g., in case the target memory state is or should be a non-conducting state) or above the reference value (e.g., in case the target memory state is or should be a conducting state).

In the figures, checking whether the memory cell is in the memory state may be symbolized by a (full) circle, indicating when the checking is carried out, e.g. indicating a time point of the checking (e.g., with respect to the provided voltage pulses). The optional checking whether the memory cell is in the memory state, e.g. the optional verifying operation, is indicated in the FIG. 2A (and, similarly, in the FIG. 2B to FIG. 3H) with the dotted circle after the one or more first voltage pulses 202w.

The write operation may include (e.g., in a first de-trapping period, TD, following the write period, Tw) providing one or more second voltage pulses 204d at the memory cell (e.g., to the at least one memory cell 102 of the memory cell arrangement 100). The one or more second voltage pulses 204d may be, for example, one or more de-trapping voltage pulses, e.g. the one or more second voltage pulses may be configured to remove trapped charges from the memory cell. The one or more second voltage pulses 204d may have a second pulse height, $H_2$, a second pulse width, $W_2$, and a second polarity. The second polarity may be opposite the first polarity (e.g., the second polarity may be a negative polarity as shown, for example, in FIG. 2A to FIG. 2C, or a positive polarity as shown, for example, in FIG. 2D to FIG. 2F). In general, the one or more de-trapping voltage pulses to de-trap charges from a memory cell may have a polarity opposite with respect to the one or more write voltage pulses to write the memory cell. The one or more second voltage pulses 204d may include a single voltage pulse or a plurality (e.g., a sequence) of voltage pulses, as described in further detail below. In some aspects, the one or more second voltage pulses 204d may include a second number of voltage pulses.

In some aspects, the one or more second voltage pulses 204d may be provided at the memory cell in case the memory cell is not in the memory state, e.g. in case the checking determined that the memory cell is not residing in the (target) memory state. In some aspects, the one or more second voltage pulses 204d may be provided at the memory cell without checking first whether the memory cell is in the memory state.

The one or more second voltage pulses 204w may be configured such that an electric field provided by the one or more second voltage pulses 204w across the memory cell may be less than a coercive field associated with the (target) memory state the memory cell is (or should be) residing in. This may be provided by varying one or more of pulse height, pulse width, and/or number of pulses with respect to the one or more first voltage pulses 202w.

In some aspects, the second pulse height, $H_2$, may be less than the first pulse height, $H_1$ (e.g., and the second pulse width, $W_2$, may be equal to the first pulse width, $W_1$, and/or the second number of pulses may be equal to the first number of pulses). In some aspects, the second pulse height, $H_2$, may be greater than the first pulse height, $H_1$, for example in case the memory cell is very asymmetric in its stack.

In some aspects, the second pulse width, $W_2$, may be less than the first pulse width, $W_1$ (e.g., and the second pulse height, $H_2$, may be equal to the first pulse height, $H_1$, and/or the second number of pulses may be equal to the first number of pulses). In some aspects, a total on-time of the one or more second voltage pulses 204d may be less than a total on-time of the one or more first voltage pulses 202w.

In some aspects, the second number of pulses may be less than the first number of pulses (e.g., and the second pulse height, $H_2$, may be equal to the first pulse height, $H_1$, and/or the second pulse width, $W_2$, may be equal to the first pulse width, $W_1$).

In some aspects, the one or more second (e.g., de-trapping) voltage pulses 204w may be provided at the memory cell after providing the one or more first (e.g., write) voltage pulses 202w. Illustratively, the memory cell may be "de-trapped" after writing. In some aspects, the one or more second (e.g., de-trapping) voltage pulses 204w may be provided at the memory cell prior to providing the one or more first (e.g., write) voltage pulses 202w. Illustratively, the memory cell may be "de-trapped" prior to writing, rather than after writing.

The write operation may further include checking whether the memory cell is in the memory state (e.g., after providing the one or more second voltage pulses 204d). Illustratively, it may be determined whether the one or more second voltage pulses 204d sufficed in de-trapping (enough or all) charges from the memory cell.

The write operation may further include, in case the memory cell is not in the memory state, providing (e.g., within the same de-trapping period, TD) one or more third voltage pulses 206d at the memory cell (e.g., to the at least one memory cell 102 of the memory cell arrangement 100). The one or more third voltage pulses 206d may be, for example, one or more additional de-trapping voltage pulses, e.g. the one or more third voltage pulses may be configured to remove trapped charges from the memory cell. The one or more third voltage pulses 206d may have a third pulse height, $H_3$, a third pulse width, $W_3$, and the second polarity (e.g., a third polarity same as the second polarity, e.g. a third polarity opposite the first polarity). The one or more third voltage pulses 206d may include a single voltage pulse or a plurality (e.g., a sequence) of voltage pulses, as described in further detail below. In some aspects, the one or more third voltage pulses 206d may include a third number of voltage pulses.

One or more properties of the one or more third voltage pulses 206d may be varied with respect to the one or more second voltage pulses 204d, as described above, e.g. to enhance or strengthen a de-trapping provided by the one or more third voltage pulses 206d with respect to the one or more second voltage pulses 204d. One or more of the conditions described below may be verified, e.g. individually or simultaneously.

Figure 2A:
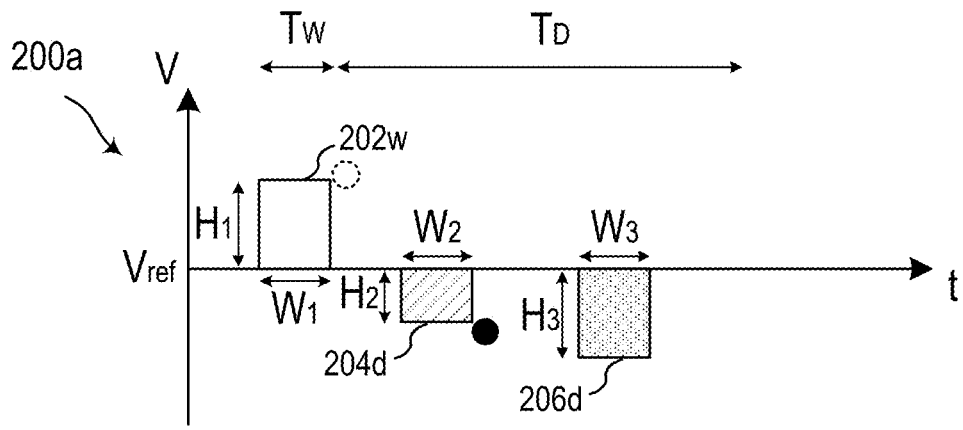
FIG. 2A to FIG. 2K each shows a diagram related to a write operation, according to various aspects.
Figure 2B:
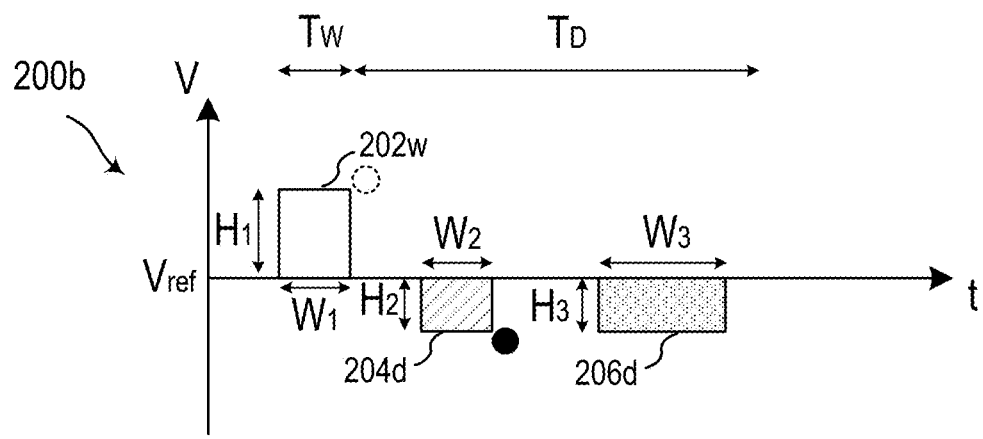
Figure 2C:
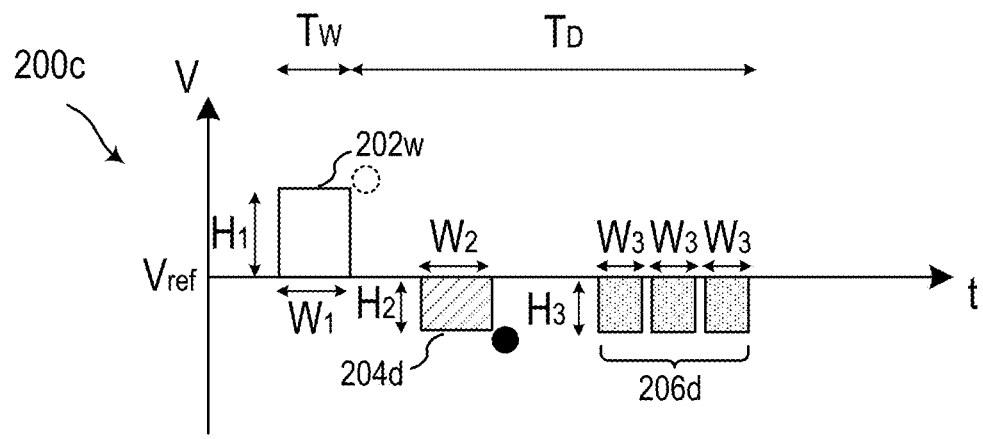
Figure 2D:
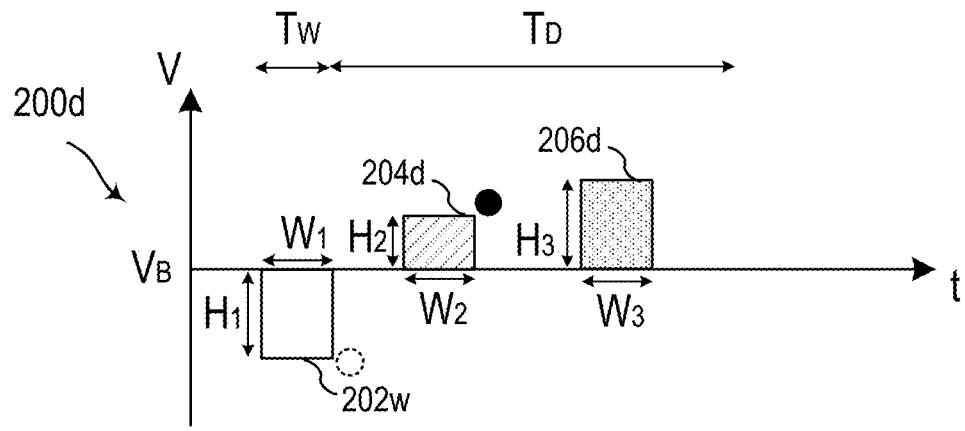

In some aspects, the third pulse height, $H_3$, may be greater than the second pulse height, $H_2$, see for example FIG. 2A and FIG. 2D. In this case, the third pulse width, $W_3$, may optionally be equal to the second pulse width, $W_2$, and/or the third number of pulses may optionally be equal to the second number of pulses. However, the third pulse width, $W_3$, may also be different from the second pulse width, $W_2$, and/or the third number of pulses may also be different from the second number of pulses.

Figure 2E:
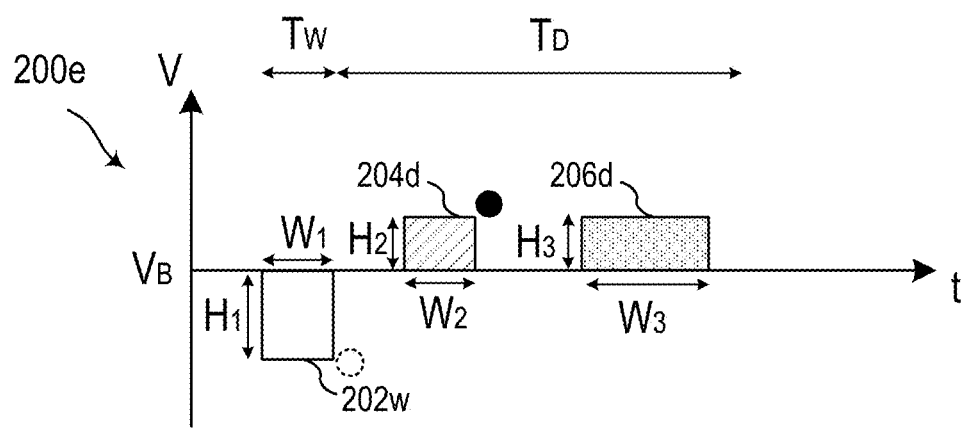

In some aspects, the third pulse width, $W_3$, may be greater than the second pulse width, $W_2$, see for example FIG. 2B and FIG. 2E. In some aspects, a total on-time of the one or more third voltage pulses 206d may be greater than a total on-time of the one or more second voltage pulses 204d. In this case, the third pulse height, $H_3$, may optionally be equal to the second pulse height, $H_2$, and/or the third number of pulses may optionally be equal to the second number of pulses. However, the third pulse height, $H_3$, may also be different from the second pulse height, $H_2$, and/or the third number of pulses may also be different from the second number of pulses.

Figure 2F:
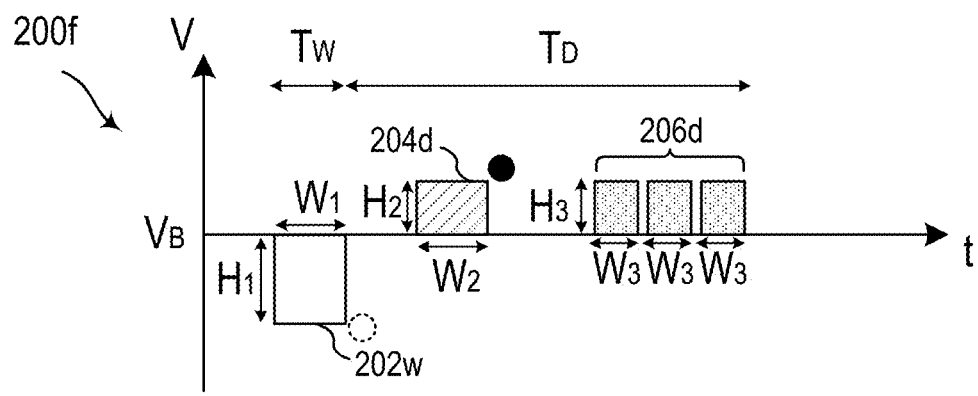

In some aspects, the third number of pulses may be greater than the second number of pulses, see for example FIG. 2C and FIG. 2F. In this case, the third pulse height, $H_3$, may optionally be equal to the second pulse height, $H_2$, and/or the third pulse width, $W_3$, may optionally be equal to the second pulse width, $W_2$. However, the third pulse height, $H_3$, may also be different from the second pulse height, $H_2$, and/or the third pulse width, $W_3$, may be different from the second pulse width, $W_2$.

The write operation may further include checking whether the memory cell is in the memory state (e.g., after providing the one or more third voltage pulses 206d). Illustratively, it may be determined whether the one or more third voltage pulses 206d sufficed in de-trapping (enough or all) charges from the memory cell, see for example FIG. 2G to FIG. 2I.

In some aspects, in case the memory cell is not (yet) in the memory state, one or more additional de-trapping voltage pulses may be provided. One or more properties of the one or more additional de-trapping voltage pulses may be varied with respect to the one or more third voltage pulses 206d, e.g. with a similar relationship between the properties of the one or more additional de-trapping voltage pulses and the properties of the one or more third voltage pulses 206d as the relationship between the properties of the one or more third voltage pulses 206d and the one or more second voltage pulses 204d described above. Illustratively, the one or more additional de-trapping voltage pulses may have at least one of a greater pulse height and/or a greater pulse width and/or a greater number of pulses with respect to the third one or more voltage pulses 206d.

In some aspects, the properties of the one or more additional de-trapping voltage pulses may be varied until respective threshold values are reached. As an example, additional de-trapping voltage pulses with increasing pulse height may be provided until a threshold value for the pulse height is reached. After each increase in the pulse height (e.g., by 250 mV) it may be checked whether the memory cell is in the memory state, and the pulse height may be further increased in case the memory cell is not in the memory state. As another example, additional de-trapping voltage pulses with increasing pulse width may be provided until a threshold value for the pulse width is reached, e.g. a threshold value for a total on-time. After each increase in the pulse width (and/or the total on-time) it may be checked whether the memory cell is in the memory state, and the pulse width (and/or the total on-time) may be further increased in case the memory cell is not in the memory state. As a further example, additional de-trapping voltage pulses with increasing number of pulses may be provided until a threshold value for the number of pulses is reached. The threshold value for the number of pulses may be associated with the threshold value for the pulse width and/or for the total on-time. After each increase in the number of pulses it may be checked whether the memory cell is in the memory state, and the number of pulses may be further increased in case the memory cell is not in the memory state.

In some aspects, in case the memory cell is not (yet) in the memory state after providing the one or more third voltage pulses 206d (e.g., in case the memory cell is not in the memory state at the end of the possible iterations within a de-trapping period, TD), one or more fourth voltage pulses 208w may be provided at the memory cell (e.g., to the at least one memory cell 102 of the memory cell arrangement 100), e.g. in a second write period, Tw, see FIG. 2G to FIG. 2K. The one or more fourth voltage pulses 208w may be, for example, one or more (additional) write voltage pulses, e.g. the one or more fourth voltage pulses 208w may be configured (or at least intended) to switch the memory state the memory cell is residing in. Illustratively, additional write voltage pulses may be provided in case the de-trapping voltage pulses did not succeed in bringing the memory cell in the desired state. The one or more fourth voltage pulses 208w may have a fourth pulse height, $H_4$, a fourth pulse width, $W_4$, and the first polarity (e.g., a fourth polarity same as the first polarity). The one or more fourth voltage pulses 208w may include a single voltage pulse or a plurality (e.g., a sequence) of voltage pulses, as described in further detail below. In some aspects, the one or more fourth voltage pulses 208w may include a fourth number of voltage pulses. In the FIG. 2G to FIG. 2K only fourth voltage pulses 208w having a positive polarity are shown, for the sake of brevity. It is understood that the considerations provided herein may apply also in case the one or more fourth voltage pulses 208w have a negative polarity (e.g., in case the one or more first voltage pulses 202w have a negative polarity, as shown in FIG. 2D to FIG. 2F).

One or more properties of the one or more fourth voltage pulses 208w may be varied with respect to the one or more first voltage pulses 202w, as described above, e.g. to enhance or strengthen a writing provided by the one or more fourth voltage pulses 208w with respect to the one or more first voltage pulses 202w. One or more of the conditions described below may be verified, e.g. individually or simultaneously.

Figure 2G:
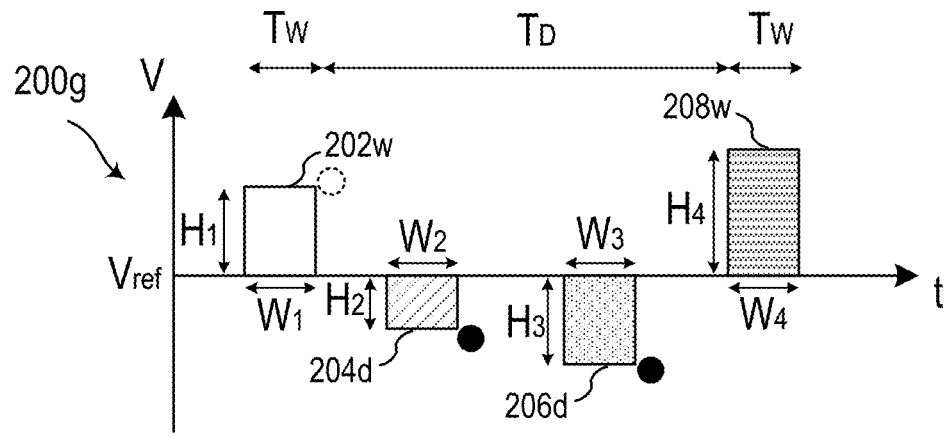

In some aspects, the fourth pulse height, $H_4$, may be greater than the first pulse height, $H_1$, see for example FIG. 2G. In this case, the fourth pulse width, $W_4$, may optionally be equal to the first pulse width, $W_1$, and/or the fourth number of pulses may optionally be equal to the first number of pulses. However, the fourth pulse width, $W_4$, may also be different from the first pulse width, $W_1$, and/or the fourth number of pulses may also be different from the first number of pulses.

Figure 2H:
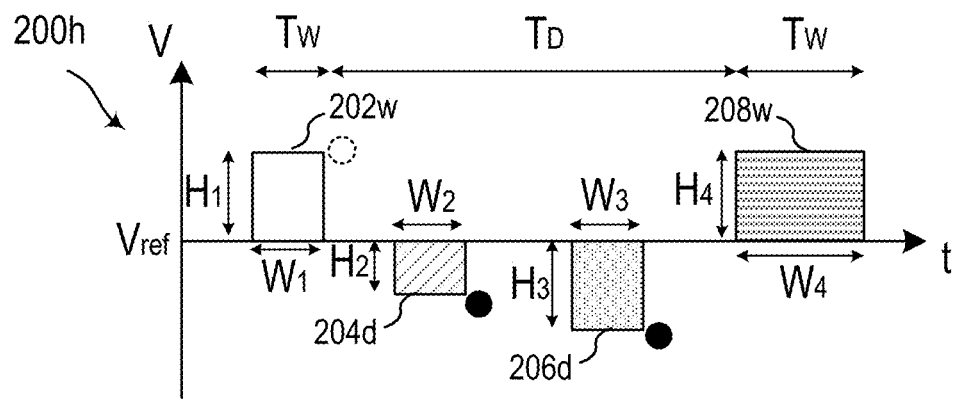

In some aspects, the fourth pulse width, $W_4$, may be greater than the first pulse width, $W_1$, see for example FIG. 2H. In some aspects, a total on-time of the one or more fourth voltage pulses 208w may be greater than a total on-time of the one or more first voltage pulses 202w. In this case, the fourth pulse height, $H_4$, may optionally be equal to the first pulse height, $H_1$, and/or the fourth number of pulses may optionally be equal to the first number of pulses. However, the fourth pulse height, $H_4$, may also be different from the first pulse height, $H_1$, and/or the fourth number of pulses may also be different from the first number of pulses.

Figure 2I:
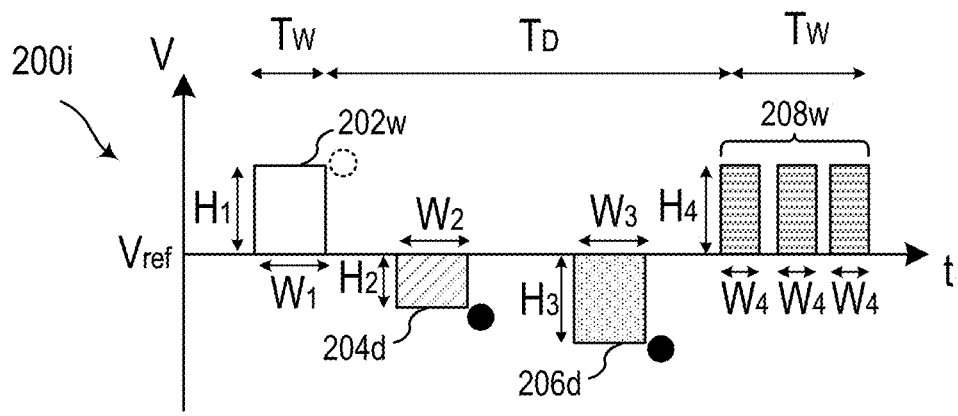

In some aspects, the fourth number of pulses may be greater than the first number of pulses, see for example FIG. 2I. In this case, the fourth pulse height, $H_4$, may optionally be equal to the first pulse height, $H_1$, and/or the fourth pulse width, $W_4$, may optionally be equal to the first pulse width, $W_2$. However, the fourth pulse height, $H_4$, may also be different from the first pulse height, $H_1$, and/or the fourth pulse width, $W_4$, may be different from the first pulse width, Wt.

After providing the one or more fourth voltage pulses 208w a new de-trapping period, TD, may start, e.g. providing de-trapping voltage pulses may be repeated (for example, in a same manner as in the first de-trapping period or in a different manner). In some aspects, it may be assumed that the memory cell may have charges trapped therein after providing the one or more fourth voltage pulses 208w, and that the memory cell does not (fully) reside in the target memory state. Accordingly, further de-trapping voltage pulses may be provided at the memory cell without checking whether the memory cell is residing in the (target) memory state. In some aspects, after providing the one or more fourth voltage pulses 208w, the write operation may include checking whether the memory cell is in the memory state.

Figure 2J:
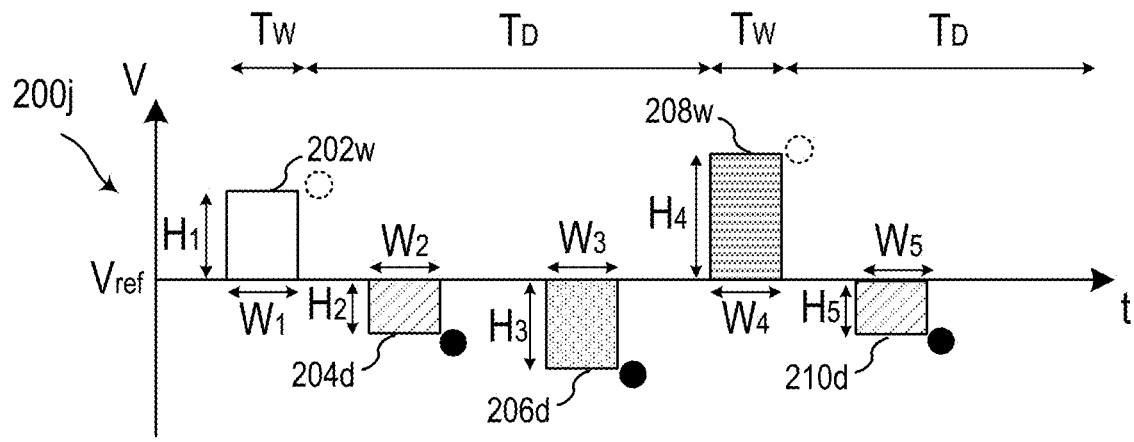
Figure 2K:
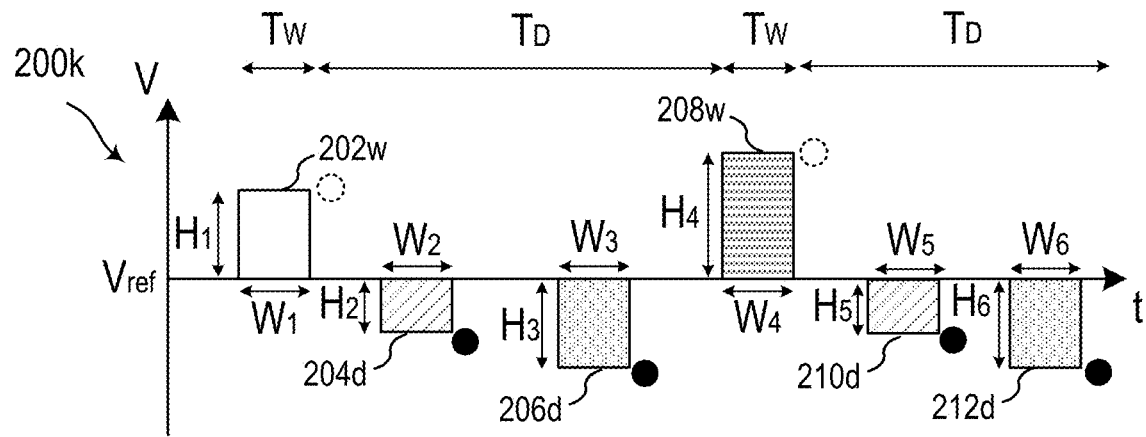

The write operation may include providing one or more fifth voltage pulses 210d at the memory cell (e.g., to the at least one memory cell 102 of the memory cell arrangement 100), e.g. in a second de-trapping period, TD, see FIGS. 2J and 2K. The one or more fifth voltage pulses 210d may be, for example, one or more de-trapping voltage pulses, e.g. the one or more fifth voltage pulses 210d may be configured to remove trapped charges from the memory cell. The one or more fifth voltage pulses 210d may have a fifth pulse height, $H_5$, a fifth pulse width, $W_5$, and the second polarity (e.g., a fifth polarity equal to the second polarity, e.g. a fifth polarity opposite the fourth polarity). The one or more fifth voltage pulses 210d may include a single voltage pulse or a plurality (e.g., a sequence) of voltage pulses, as described in further detail below. In some aspects, the one or more fifth voltage pulses 210d may include a fifth number of voltage pulses.

In some aspects, the one or more fifth voltage pulses 210d may be provided at the memory cell in case the memory cell is not in the memory state, e.g. in case the checking determined that the memory cell is not residing in the (target) memory state. In some aspects, the one or more fifth voltage pulses 210d may be provided at the memory cell without checking first whether the memory cell is in the memory state.

In some aspects, the one or more fifth voltage pulses 210d may have substantially the same properties as the one or more second voltage pulses 204d. Illustratively, a same de-trapping may be provided. By way of example, the fifth pulse height, $H_5$, may be substantially equal to the second pulse height, $H_2$. Additionally or alternatively, the fifth pulse width, $W_5$, may be substantially equal to the second pulse width, $W_2$, e.g. a total on-time of the one or more fifth voltage pulses 210d may be substantially equal to the total on-time of the one or more second voltage pulses 204d. Additionally or alternatively, the fifth number of voltage pulses may be substantially equal to the second number of voltage pulses.

In some other aspects, the one or more fifth voltage pulses 210d may have one or more different properties with respect to the one or more second voltage pulses 204d, e.g. may be distinct with respect to the one or more second voltage pulses 204d in at least one of pulse height, pulse width, total on-time, and/or number of pulses. Illustratively, the de-trapping may be modified after different write voltage pulses, e.g. in different de-trapping periods.

The write operation may further include checking whether the memory cell is in the memory state (e.g., after providing the one or more fifth voltage pulses 210d). Illustratively, it may be determined whether the one or more fifth voltage pulses 210d sufficed in de-trapping (enough or all) charges from the memory cell.

The write operation may further include, in case the memory cell is not in the memory state, providing one or more sixth voltage pulses 212d at the memory cell (e.g., to the at least one memory cell 102 of the memory cell arrangement 100), e.g. within the same de-trapping period, TD, see FIG. 2K. The one or more sixth voltage pulses 212d may be, for example, one or more additional de-trapping voltage pulses, e.g. the one or more sixth voltage pulses 212d may be configured to remove trapped charges from the memory cell. The one or more third sixth pulses 212d may have a sixth pulse height, $H_6$, a sixth pulse width, $W_6$, and the second polarity (e.g., the fifth polarity, e.g. a sixth polarity same as the second polarity, e.g. a sixth polarity opposite the first polarity). The one or more sixth voltage pulses 212d may include a single voltage pulse or a plurality (e.g., a sequence) of voltage pulses, as described in further detail below. In some aspects, the one or more sixth voltage pulses 212d may include a sixth number of voltage pulses.

One or more properties of the one or more sixth voltage pulses 212d may be varied with respect to the one or more fifth voltage pulses 210d, e.g. in a similar manner as the properties of the one or more third voltage pulses 206d with respect to the properties of the one or more second voltage pulses 204d. One or more of the conditions described below may be verified, e.g. individually or simultaneously.

In some aspects, the sixth pulse height, $H_6$, may be greater than the fifth pulse height, $H_5$, see for example FIG. 2K. In this case, the sixth pulse width, $W_6$, may optionally be equal to the fifth pulse width, $W_5$, and/or the sixth number of pulses may optionally be equal to the fifth number of pulses. However, the sixth pulse width, $W_6$, may also be different from the fifth pulse width, $W_5$, and/or the sixth number of pulses may be different from the fifth number of pulses.

In some aspects, the sixth pulse width, $W_6$, may be greater than the fifth pulse width, $W_5$ (not shown). In some aspects, a total on-time of the one or more sixth voltage pulses 212d may be greater than a total on-time of the one or more fifth voltage pulses 210d. In this case, the sixth pulse height, $H_6$, may optionally be equal to the fifth pulse height, $H_5$, and/or the sixth number of pulses may optionally be equal to the fifth number of pulses. However, the sixth pulse height, $H_6$, may also be different from the fifth pulse height, $H_5$, and/or the sixth number of pulses may be different from the fifth number of pulses.

In some aspects, the sixth number of pulses may be greater than the fifth number of pulses (not shown). In this case, the sixth pulse height, $H_6$, may optionally be equal to the fifth pulse height, $H_5$, and/or the sixth pulse width, $W_6$, may optionally be equal to the fifth pulse width, $W_5$. However, the sixth pulse height, $H_6$, may also be different from the fifth pulse height, $H_5$, and/or the sixth pulse width, $W_6$, may be different from the fifth pulse width, $W_5$.

In some aspects, the write operation may further include checking whether the memory cell is in the memory state (e.g., after providing the one or more sixth voltage pulses 212d). Illustratively, it may be determined whether the one or more sixth voltage pulses 212d sufficed in de-trapping (enough or all) charges from the memory cell.

The write operation may include, in case the memory cell is not in the memory state, providing further de-trapping voltage pulses and/or further write voltage pulses. Illustratively, the write operation may continue with a succession of de-trapping periods and write periods until the memory cell reaches the target memory state or until the respective threshold levels for the pulse properties are reached.

FIG. 3A to FIG. 3H illustrate possible further configurations of the de-trapping writing scheme, e.g. possible further combinations of write voltage pulses and de-trapping voltage pulses. It is understood that the processes described in relation to FIG. 3A to FIG. 3H are only possible examples, and are to be interpreted in a non-limiting manner, i.e. other permutations or combinations of write voltage pulses and de-trapping voltage pulses may be possible. In some of the FIG. 3A to FIG. 3H a configuration is illustrated only for one polarity of the write voltage pulses and de-trapping voltage pulses, it is however understood that a same configuration may be correspondingly adapted to the opposite polarity for the write voltage pulses and de-trapping voltage pulses.

As shown in the FIG. 3A to FIG. 3H, the memory state of the memory cell may be checked (e.g., verified) after each de-trapping voltage pulse or each group (e.g., sequence) of de-trapping voltage pulses. In some aspects, the memory state of the memory cell may also be checked after each write voltage pulse or each group (e.g., sequence) of write voltage pulses (e.g., at the end of each write period, Tw). The write operation may be interrupted as soon as it is determined that the memory cell is in the (target) memory state, as described above (see for example FIG. 3E to FIG. 3H). Otherwise, the write operation may proceed with further write periods (and write voltage pulses) and de-trapping periods (and de-trapping voltage pulses) until the respective threshold levels for the pulse properties are reached, as described above. As an example, properties of (e.g., write or de-trapping) voltage pulses described in relation with one of the FIG. 3A to FIG. 3H may be combined with the properties of (e.g., write or de-trapping) voltage pulses described in relation with another one of the FIG. 3A to FIG. 3H.

Figure 3A:
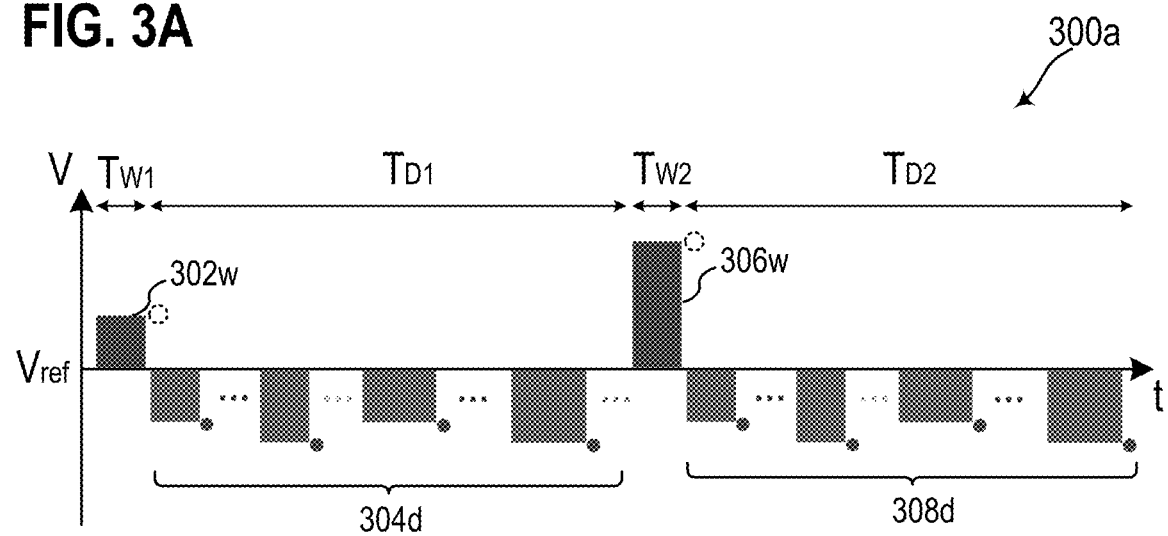
FIG. 3A to FIG. 3H each shows a diagram related to a write operation, according to various aspects.
Figure 3B:
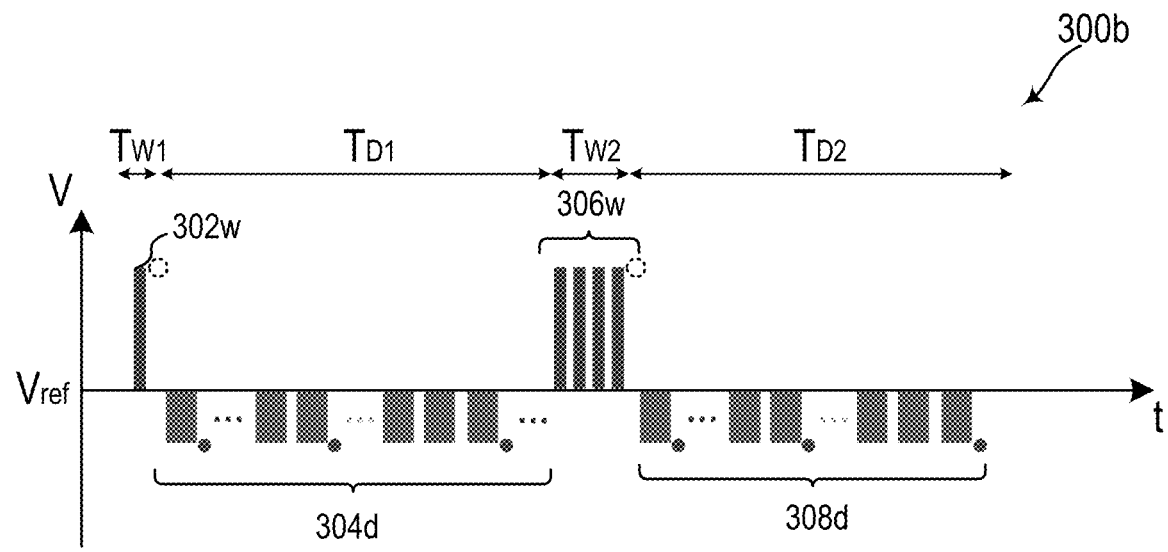
Figure 3C:
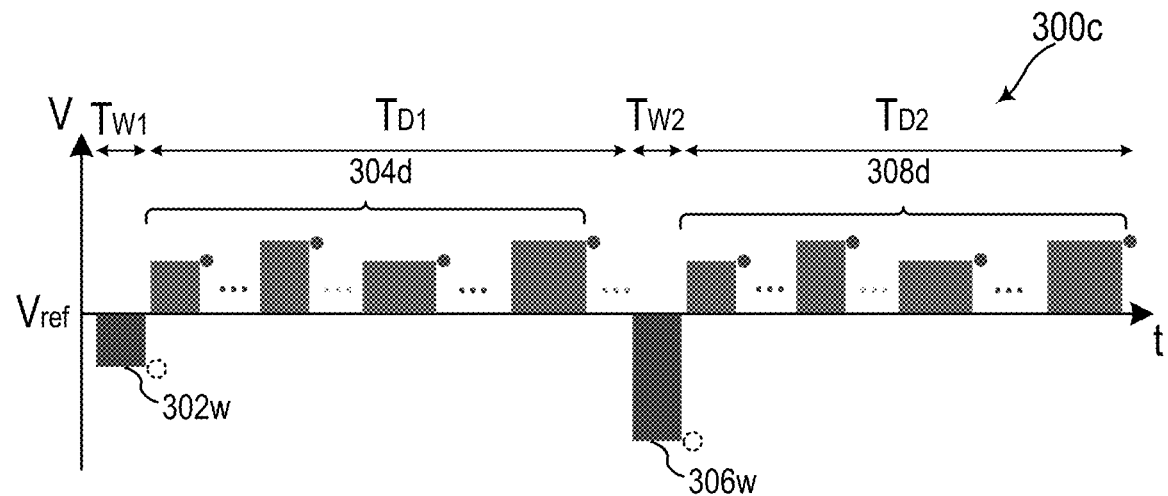

As shown, for example, in FIG. 3A (for write voltage pulses with positive polarity) and in FIG. 3C (for write voltage pulses with negative polarity), the pulse height of write voltage pulses may be increased in a write period with respect to the pulse height of write voltage pulses in the previous write period. One or more first (e.g., write) voltage pulses 302w may be provided in a first write period, Twi, having a first pulse height less than a second pulse height of second (e.g., write) voltage pulses 306w provided in a second write period, $T_{W2}$.

Figure 3D:
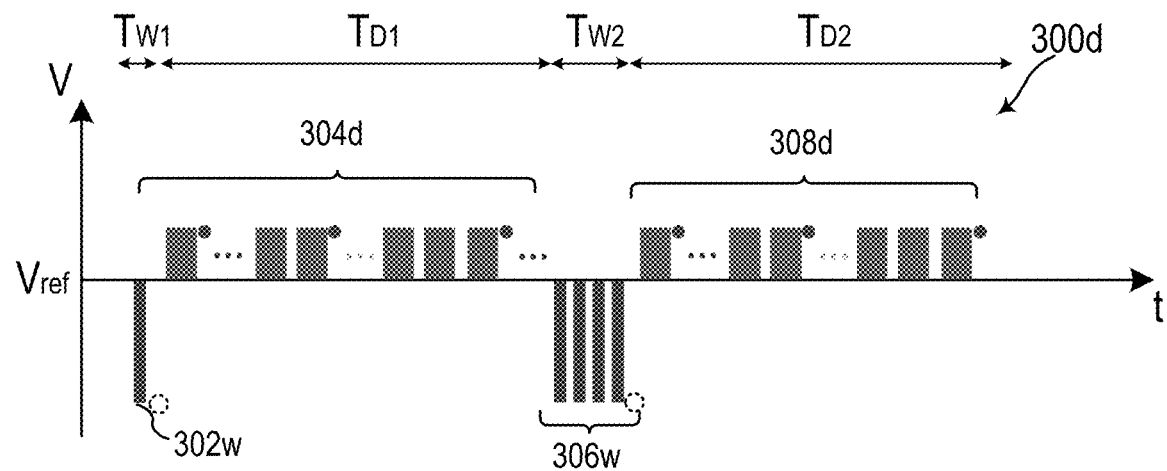

As shown, for example, in FIG. 3B (for write voltage pulses with positive polarity) and in FIG. 3D (for write voltage pulses with negative polarity), the number of pulses of write voltage pulses may be increased in a write period with respect to the number of pulses of write voltage pulses in the previous write period. One or more (e.g., write) voltage pulses 302w may be provided in a first write period, Twi, having a first number of pulses less than a second number of pulses of (e.g., write) voltage pulses 306w provided in a second write period, $T_{W2}$.

As shown, for example, in in FIG. 3A (for de-trapping voltage pulses with negative polarity) and in FIG. 3C (for de-trapping voltage pulses with positive polarity), the pulse height and/or the pulse width of de-trapping voltage pulses may be varied within a de-trapping period. During a de-trapping period (e.g., a first de-trapping period, $T_{D1}$, or a second de-trapping period, $T_{D2}$) voltage pulses 304d, 308d, e.g. de-trapping voltage pulses, may be provided having increasing pulse height and/or increasing pulse width. Illustratively, a voltage pulse may have at least one of a greater pulse height and/or a greater pulse width with respect to at least one other precedent voltage pulse provided during the same de-trapping period. In the FIG. 3A and FIG. 3C the same voltage pulses 304d, 308d are provided in the first de-trapping period, $T_{D1}$, and in the second de-trapping period, $T_{D2}$, it is however understood that voltage pulses in different de-trapping periods may vary.

As shown, for example, in in FIG. 3B (for de-trapping voltage pulses with negative polarity) and in FIG. 3D (for de-trapping voltage pulses with positive polarity), the number of pulses of de-trapping voltage pulses may be varied within a de-trapping period. Illustratively, during a de-trapping period, voltage pulses 304d, 308d may be provided in groups including an increasing number of voltage pulses. One or more voltage pulses provided during a de-trapping period may include a number of voltage pulses greater than a number of voltage pulses of one or more other precedent voltage pulses provided during the same de-trapping period. In FIG. 3A and in FIG. 3C the voltage pulses in the first de-trapping period, $T_{D1}$, and in the second de-trapping period, $T_{D2}$, are shown having a same pulse height and a same pulse width, it is however understood that voltage pulses of a group of voltage pulses may have a different pulse height and/or a different pulse width with respect to the voltage pulses of another group of voltage pulses within a same de-trapping period.

Figure 3E:
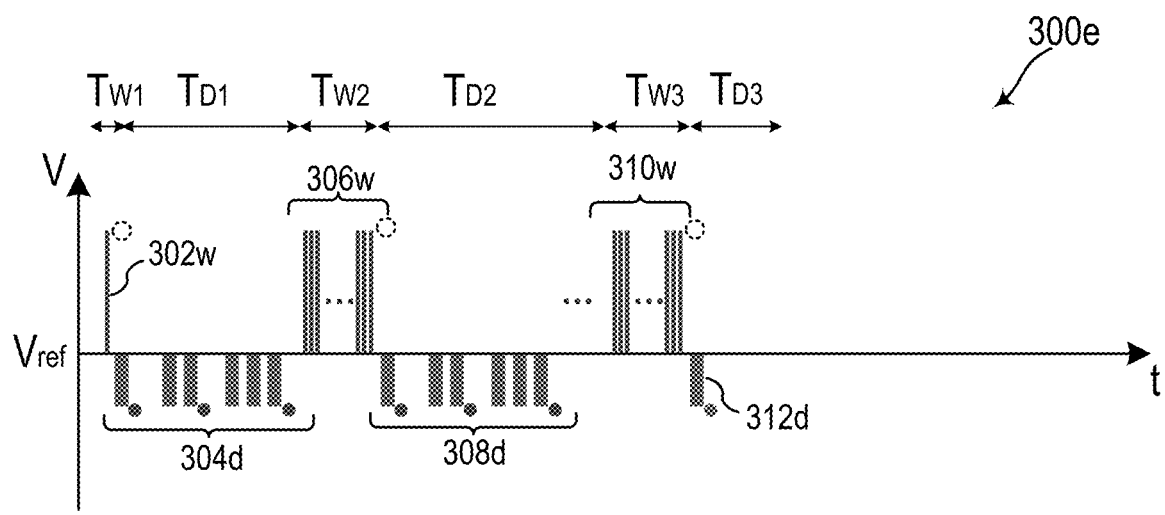
Figure 3F:
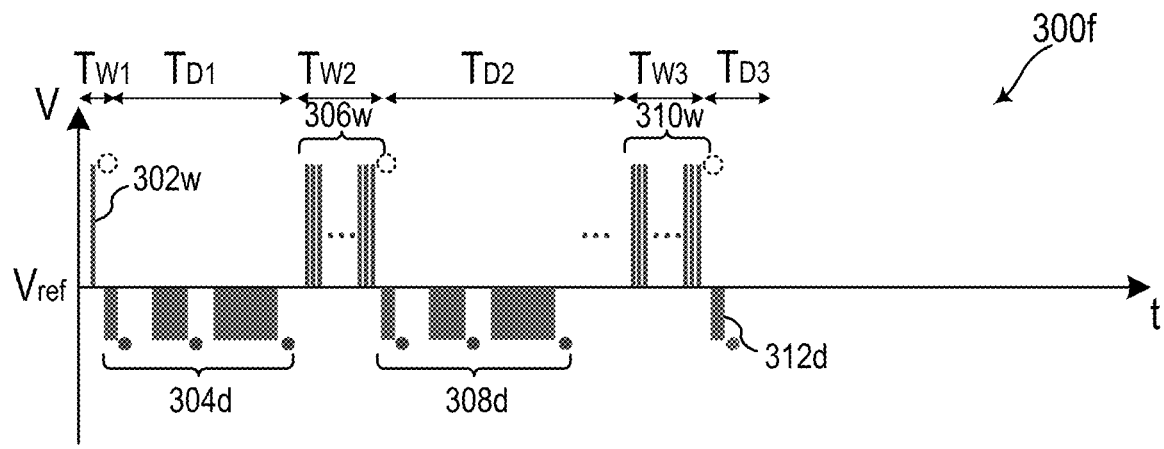

As shown, for example, in FIG. 3E and FIG. 3F the voltage pulses during a write period may have a short pulse width (e.g., equal to or lower than 10 ns), and increasing numbers of voltage pulses may be provided in subsequent write periods. In some aspects, the number of voltage pulses in subsequent write periods may be a multiple of the number of voltage pulses in the preceding time period, e.g. 2×, 5×, 10×, 100×, etc. Only as a numerical example, in a first write period, Twi, a single voltage pulse 302w may be provided. In a second time period, $T_{W2}$, ten voltage pulses 306w may be provided. In a third write period, $T_{W3}$, one hundred (or one thousand) voltage pulses 310w may be provided.

As shown, for example, in FIG. 3E and FIG. 3F the write operation may be interrupted, e.g. during a de-trapping period (or, in some aspects, before a de-trapping period), in case the checking of the memory state of the memory cell after providing a de-trapping voltage pulse indicates that the memory cell is in the target memory state. As an example, in FIG. 3E, voltage pulses 304d, 308d including increasing numbers of voltage pulses may be provided during a de-trapping period (e.g., during a first de-trapping period, $T_{D1}$, and a second de-trapping period, $T_{D2}$), until a threshold for the number of voltage pulses is reached (and the following write period begins). During one of the de-trapping periods, e.g. a third de-trapping period, $T_{D3}$, the provision of voltage pulses 312d may be stopped in case it is determined that the memory cell is in the target memory state. As another example, in FIG.F, voltage pulses 304d, 308d having increasing pulse width may be provided during a de-trapping period (e.g., during a first de-trapping period, $T_{D1}$, and a second de-trapping period, $T_{D2}$), until a threshold for the pulse width is reached (and the following write period begins). During one of the de-trapping periods, e.g. a third de-trapping period, $T_{D3}$, the provision of voltage pulses 312d may be stopped in case it is determined that the memory cell is in the target memory state.

Figure 3G:
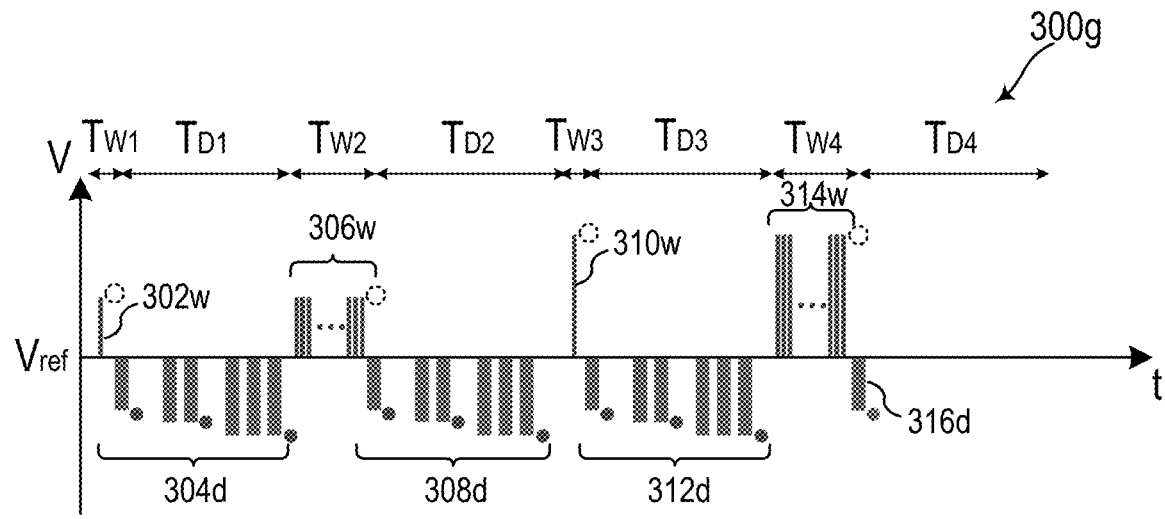
Figure 3H:
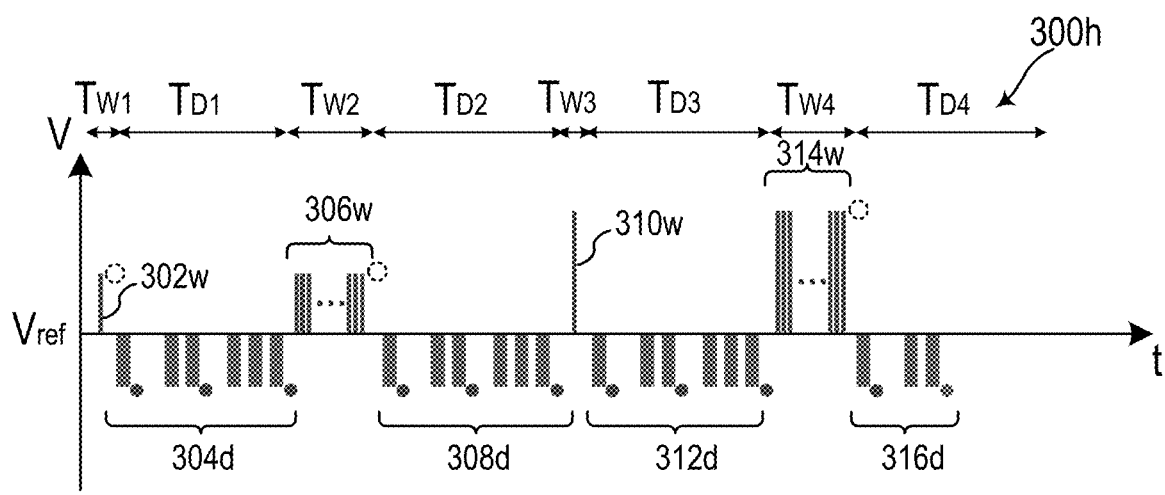

As shown, for example, in FIG. 3G and FIG. 3H, the pulse height of write voltage pulse may be varied in combination with varying the number of pulses. In some aspects, using a comparatively small pulse height for writing a memory cell may reduce the trapping of charges in the memory cell. The switching of the memory state may be induced by application of series of pulses having the same pulse height. It may be beneficial, in some aspects, to start writing the memory cell with a comparatively small pulse height, and then increasing the pulse height in case the memory cell is not into the target memory state.

As an example, in FIG. 3G and FIG. 3H, voltage pulses 302w, 306w during a first write period, Twi, and a second write period, $T_{W2}$, may have a same pulse height smaller than the pulse height of voltage pulses 310w, 314w during subsequent third write period, $T_{W3}$, and fourth write period, $T_{W4}$.

For each pulse height, the number of voltage pulse may be increased in consecutive write periods until the threshold number of voltage pulses is reached, before the pulse height is increased. As shown in FIG. 3G and FIG. 3H, the voltage pulses 302w, 306w during the first write period, Twi, and the second write period, $T_{W2}$, may have the same pulse height, and the number of voltage pulses 306w in the second write period, $T_{W2}$, may be greater (e.g., ten times greater) than the number of voltage pulses 302w in the first write period, Twi. The voltage pulses 310w, 314w during the third write period, $T_{W3}$, and the fourth write period, $T_{W4}$, may have the same pulse height, and the number of voltage pulses 314w in the fourth write period, Two, may be greater (e.g., ten times greater) than the number of voltage pulses 310w in the third write period, $T_{W3}$.

As shown, for example, in FIG. 3G, the pulse height of de-trapping voltage pulses may be varied in combination with varying the number of pulses. During a same de-trapping period (e.g., a first de-trapping period, $T_{D1}$, a second de-trapping period, $T_{D2}$, a third de-trapping period, $T_{D3}$) voltage pulses 304d, 308d, 312d having increasing pulse height and increasing number of voltage pulses may be provided, e.g. until the respective thresholds for pulse height and number of pulses are reached. Similarly, not shown, the pulse width of de-trapping voltage pulses may be varied in combination with varying the number of pulses. During a same de-trapping period voltage pulses having increasing pulse width and increasing number of voltage pulses may be provided. During one of the de-trapping periods, e.g. a fourth de-trapping period, $T_{D4}$, the provision of voltage pulses 316d may be stopped in case it is determined that the memory cell is in the target memory state (see also FIG. 3H).

Figure 4:
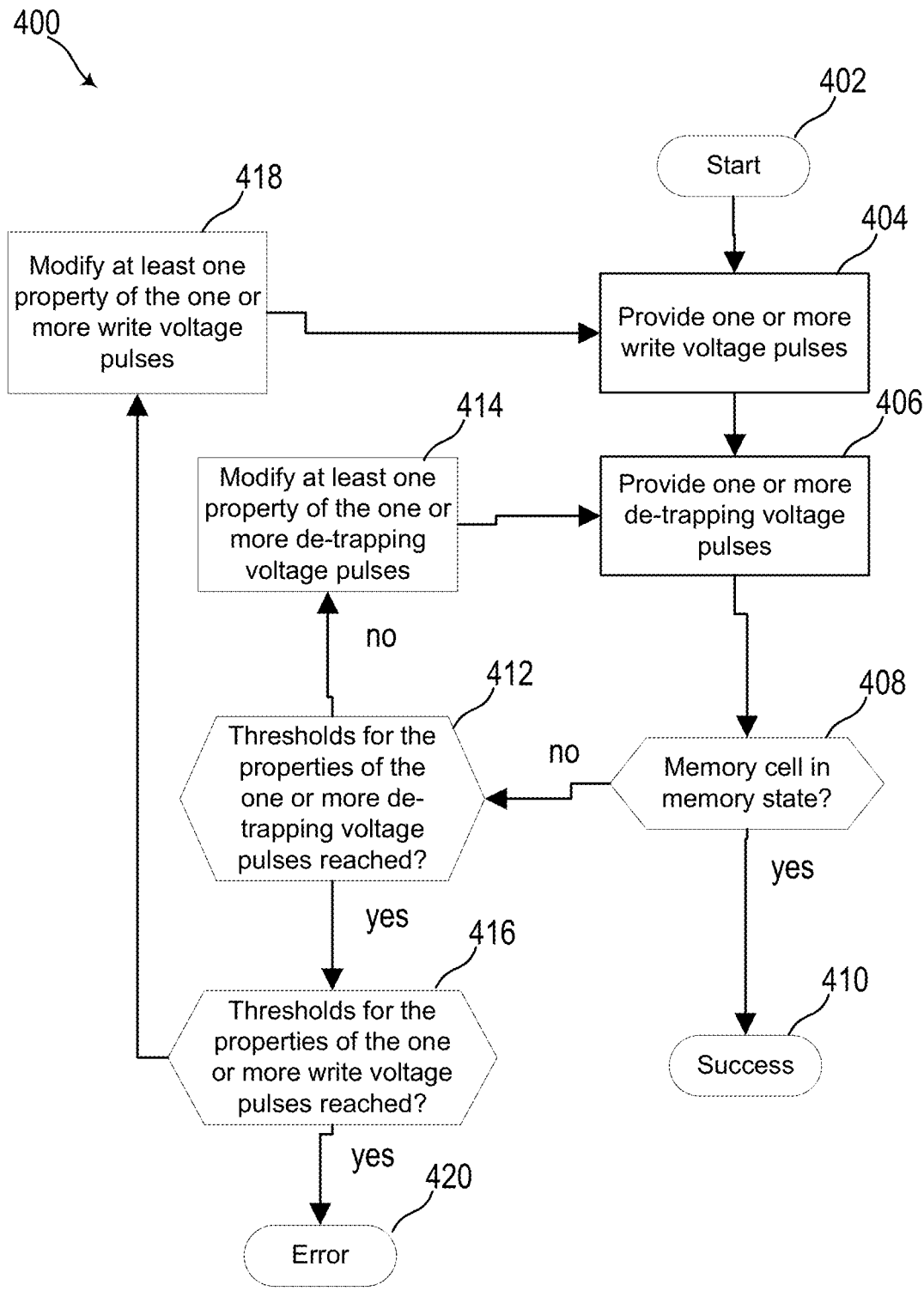
FIG. 4 shows a schematic process flow of an algorithm for operating a memory cell arrangement, according to various aspects.

FIG. 4 illustrates a schematic flow diagram of an algorithm 400 for operating a memory cell arrangement (e.g., the memory cell arrangement 100) representing the de-trapping writing scheme described herein. The algorithm 400, e.g. the write operation, may start in 402, e.g. a memory cell to be written may be selected. The algorithm 400 may be carried out by one or more processors (e.g., by the control circuit 110). The algorithm 400 may be encoded in a computer program, e.g. instructions representing the algorithm steps may be encoded in a computer program.

In 404, one or more (e.g., first) write voltage pulses may be provided at the memory cell, e.g. one or more voltage pulses having a first pulse height, $H_1$, a first pulse width, $W_1$, a first polarity, and a first number of pulses. Optionally, the algorithm 400 may include (e.g., after providing the one or more write voltage pulses at the memory cell) checking whether the memory cell is in the memory state. In case the memory cell is in the memory state, the operation may be terminated indicating a success (e.g., going to step 410). In case the memory cell is not in the memory state the algorithm 400 may continue to step 406.

In 406, one or more (e.g., second) de-trapping voltage pulses may be provided at the memory cell, e.g. one or more voltage pulses having a second pulse height, $H_2$, a second pulse width, $W_2$, a second polarity opposite the first polarity, and a second number of pulses. Optionally, in some aspects, the memory state of the memory cell may be checked after providing the one or more (e.g., first) write voltage pulses, and the one or more (e.g., second) de-trapping voltage pulses may be provided in case it is determined that the memory cell is not in the memory state.

In 408, after providing the one or more de-trapping voltage pulses, the algorithm 400 may include checking whether the memory cell is in the memory state. In case the memory cell is in the memory state (i.e., if "yes"), the write operation may be terminated with success, in 410, e.g. the success of the write operation may be determined or indicated.

In case the memory cell is not in the memory state (i.e., if "no"), the algorithm 400 may proceed to step 412, in which it may be verified whether the respective threshold values for the properties of the de-trapping voltage pulses have been reached, e.g. whether the threshold for the pulse height, and/or the threshold for the pulse width (and/or the total on-time), and/or the threshold for the number of pulses have been reached.

In case the thresholds, or at least one of the thresholds, have not yet been reached (i.e., if "no"), the algorithm 400 may proceed to step 414, in which at least one property of the de-trapping voltage pulses is modified, e.g. at least one of pulse height, pulse width, total on-time, or number of pulses. Illustratively, at least one of pulse height, pulse width, total on-time or number of pulses may be increased with respect to the pulse height, pulse width, total on-time or number of pulses of the de-trapping voltage pulses provided in the previous iteration. In some aspects, one property may be selected to be monitored and increased, e.g. only one of the properties may be used to provide modified de-trapping voltage pulses. In some aspects, more than one or all the properties may be modified, e.g. sequentially, e.g. in a first iteration the pulse width (and/or the total on-time) may be increased and after the threshold for the pulse width (and/or the total on-time) is reached, in a further iteration, one of the pulse height or the pulse number may be increased, and after the respective threshold is reached, in a further iteration, the other one of pulse height or the pulse number may be increased. In some aspects, more than one or all the properties may be modified simultaneously, e.g. in an iteration each of the pulse height, pulse width, total on-time, and number of pulses of the de-trapping voltage pulses may be increased with respect to the pulse height, pulse width, total on-time, and number of pulses of the de-trapping voltage pulses provided in the previous iteration.

The algorithm 400 may then go back to step 406 and provide the new de-trapping voltage pulse at the memory cell.

In case in step 412 it is determined that the thresholds, or at least the respective threshold of the selected properties, have been reached (i.e., if "yes"), the algorithm may proceed to step 416, in which it may be verified whether the respective thresholds for the properties of the write voltage pulses have been reached, e.g. whether the threshold for the pulse height, and/or the threshold for the pulse width, the threshold for the total on-time, and/or the threshold for the number of pulses have been reached.

In case the thresholds, or at least one of the thresholds, have not yet been reached (i.e., if "no"), the algorithm 400 may proceed to step 418, in which at least one property of the write voltage pulses is modified, e.g. at least one of pulse height, pulse width, total on-time, or number of pulses. Illustratively, at least one of pulse height, pulse width, total on-time, or number of pulses may be increased with respect to the pulse height, pulse width, total on-time, or number of pulses of the write voltage pulses provided in the previous iteration. In some aspects, one property may be selected to be monitored and increased, e.g. only one of the properties may be used to provide modified write voltage pulses. In some aspects, more than one or all the properties may be modified, e.g. sequentially, e.g. in a first iteration the pulse width (and/or the total on-time) may be increased and after the threshold for the pulse width (and/or the total on-time) is reached, in a further iteration, one of the pulse height or the pulse number may be increased, and after the respective threshold is reached, in a further iteration, the other one of pulse height or the pulse number may be increased. In some aspects, more than one or all the properties may be modified simultaneously, e.g. in an iteration each of the pulse height, pulse width, total on-time, and number of pulses of the write voltage pulses may be increased with respect to the pulse height, pulse width, total on-time, and number of pulses of the write voltage pulses provided in the previous iteration.

In case in step 416 it is determined that the thresholds, or at least the respective threshold of the selected properties, have been reached (i.e., if "yes"), the algorithm 400 may indicate an error, in 420. Illustratively, it may be determined 416 that all the available (or allowable) options for modifying the de-trapping voltage pulses and the write voltage pulses have been tried without success, e.g. without bringing the memory cell into the target memory state. In this case, the write operation may fail, and for example the memory cell may be discarded for future operations.

Figure 5:
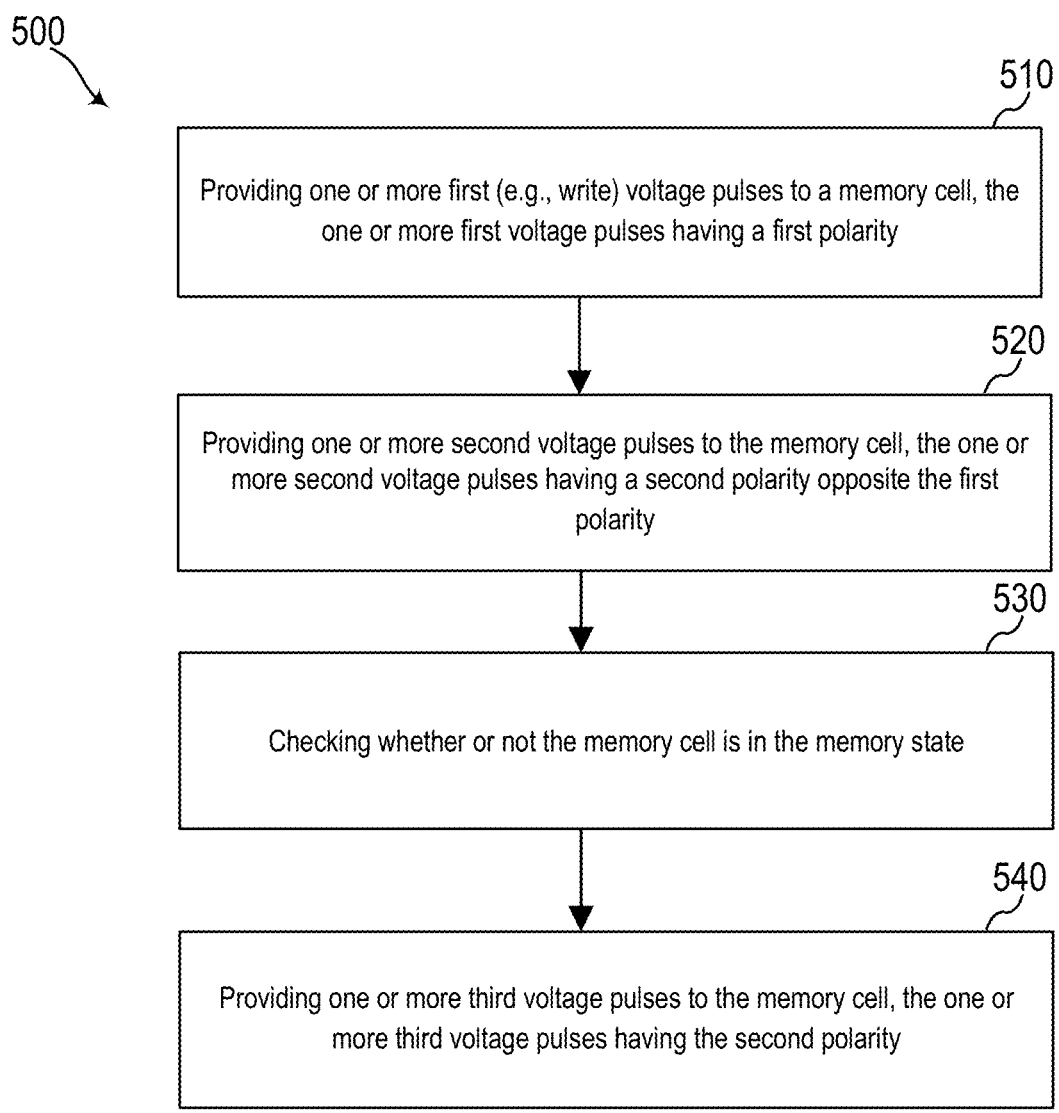
FIG. 5 shows a schematic flow diagram of a method for operating a memory cell arrangement, according to various aspects.

FIG. 5 shows a schematic flow diagram of a method 500 for operating a memory cell arrangement (e.g., the memory cell arrangement 500). The method 500 may be, illustratively, a method for writing a memory cell into a memory state.

The method 500 may include, in 510, providing one or more first (e.g., write) voltage pulses at the memory cell, the one or more first voltage pulses having a first pulse height and a first polarity.

The method 500 may include, in 520, providing one or more second voltage pulses at the memory cell, the one or more second voltage pulses having a second polarity opposite the first polarity.

The method 500 may include, in 530, checking whether or not the memory cell is in the memory state.

In the case that the memory cell is not in the memory state, the method 500 may include, in 540, providing one or more third voltage pulses at the memory cell, the one or more third voltage pulses having the second polarity. The one or more third voltage pulses may be distinct from the one or more second voltage pulses with respect to at least one of the following: a pulse height of the one or more third voltage pulses is different from a pulse height of the one or more second voltage pulses, a pulse width of the one or more third voltage pulses is different from a pulse width of the one or more second voltage pulses, a total on-time of the one or more third voltage pulses is different from a total on time of the one or more second voltage pulses, and/or a number of the one or more third voltage pulses is different from a number of the one or more second voltage pulses.

In the following, various examples are provided that may include one or more aspects described above with reference to a memory cell arrangement (e.g., the memory cell arrangement 100) and a method (e.g., the method 500). It may be intended that aspects described in relation to the memory arrangement may apply also to the method, and vice versa.

Example 1 is a memory cell arrangement including: a control circuit configured to carry out a write operation to write at least one memory cell of the memory cell arrangement into a memory state, wherein the at least one memory cell includes a field-effect transistor structure and a memory element integrated in the field effect transistor structure, and wherein the write operation includes: providing one or more first voltage pulses at the at least one memory cell, the one or more first voltage pulses having a first polarity; providing one or more second voltage pulses at the at least one memory cell, the one or more second voltage pulses having a second polarity opposite the first polarity; checking whether or not the at least one memory cell is in the memory state; and, in the case that the at least one memory cell is not in the memory state, providing one or more third voltage pulses at the at least one memory cell, the one or more third voltage pulses having the second polarity, wherein the one or more third voltage pulses are different from the one or more second voltage pulses with respect to at least one of the following: a pulse height of the one or more third voltage pulses is different from a pulse height of the one or more second voltage pulses, a pulse width of the one or more third voltage pulses is different from a pulse width of the one or more second voltage pulses, a total on-time of the one or more third voltage pulses is different from a total on time of the one or more second voltage pulses, and/or a number of the one or more third voltage pulses is different from a number of the one or more second voltage pulses.

In Example 2, the memory cell arrangement of example 1 may optionally further include that the pulse height of the one or more third voltage pulses is greater than the second pulse height of the one or more second voltage pulses.

In Example 3, the memory cell arrangement of example 1 or 2 may optionally further include that the pulse width of the one or more third voltage pulses is greater than the pulse width of the one or more second voltage pulses.

In Example 4, the memory cell arrangement of any one of examples 1 to 3 may optionally further include that the total on-time of the one or more third voltage pulses is greater than the total on-time of the one or more second voltage pulses, or that a sum of pulse widths of the one or more third voltage pulses is greater than a sum of pulse widths of the one or more second voltage pulses.

In Example 5, the memory cell arrangement of any one of examples 1 to 4 may optionally further include that the number of the one or more third voltage pulses is greater than the number of the one or more second voltage pulses.

In Example 6, the memory cell arrangement of any one of examples 1 to 5 may optionally further include the write operation further includes after providing the one or more third voltage pulses at the at least one memory cell, checking whether or not the at least one memory cell is in the memory state; and, in the case that the at least one memory cell is not in the memory state, providing one or more fourth voltage pulses at the at least one memory cell, the one or more fourth voltage pulses having the first polarity, wherein the one or more fourth voltage pulses are different from the one or more first voltage pulses with respect to at least one of the following: a pulse height of the one or more fourth voltage pulses is different from a first pulse height of the one or more first voltage pulses, a pulse width of the one or more fourth voltage pulses is different from a pulse width of the one or more first voltage pulses, a total on-time of the one or more fourth voltage pulses is different from a total on time of the one or more first voltage pulses, and/or a number of the one or more fourth voltage pulses is different from a number of the one or more first voltage pulses.

In Example 7, the memory cell arrangement of example 6 may optionally further include that the pulse height of the one or more fourth voltage pulses is greater than the pulse height of the one or more first voltage pulses.

In Example 8, the memory cell arrangement of example 6 or 7 may optionally further include that the pulse width of the one or more fourth voltage pulses is greater than the pulse width of the one or more first voltage pulses.

In Example 9, the memory cell arrangement of any one of examples 6 to 8 may optionally further include that the total on-time of the one or more fourth voltage pulses is greater than the total on-time of the one or more first voltage pulses, or that a sum of pulse widths of the one or more fourth voltage pulses is greater than a sum of pulse widths of the one or more first voltage pulses.

In Example 10, the memory cell arrangement of any one of examples 6 to 9 may optionally further include that the number of the one or more fourth voltage pulses is greater than the number of the one or more first voltage pulses.

In Example 11, the memory cell arrangement of any one of examples 6 to 10 may optionally further include, after providing the one or more fourth voltage pulses at the at least one memory cell, providing one or more fifth voltage pulses at the at least one memory cell, the one or more fifth voltage pulses having the second polarity.

In Example 12, the memory cell arrangement of example 11 may optionally further include that a pulse height of the one or more fifth voltage pulses is substantially equal to the pulse height of the one or more second voltage pulses, and/or that a pulse width of the one or more fifth voltage pulses is substantially equal to the pulse width of the one or more second voltage pulses, and/or that a total on-time of the one or more fifth voltage pulses is substantially equal to the total on-time of the one or more second voltage pulses, and/or that a number of the one or more fifth voltage pulses is substantially equal to the number of the one or more second voltage pulses.

In Example 13, the memory cell arrangement of example 11 or 12 may optionally further include after providing the one or more fifth voltage pulses at the at least one memory cell, checking whether or not the at least one memory cell is in the memory state, and, in the case that the at least one memory cell is not in the memory state, providing one or more sixth voltage pulses at the at least one memory cell, the one or more sixth voltage pulses having the second polarity, wherein the one or more sixth voltage pulses are different from the one or more fifth voltage pulses with respect to at least one of the following: a pulse height of the one or more sixth voltage pulses is different from the pulse height of the one or more fifth voltage pulses, a pulse width of the one or more sixth voltage pulses is different from the pulse width of the one or more fifth voltage pulses, a total on-time of the one or more sixth voltage pulses is different from the total on-time of the one or more fifth voltage pulses, and/or a number of the one or more sixth voltage pulses is different from the number of the one or more fifth voltage pulses.

In Example 14, the memory cell arrangement of example 13 may optionally further include that the pulse height of the one or more sixth voltage pulses is greater than the pulse height of the one or more fifth voltage pulses.

In Example 15, the memory cell arrangement of example 13 or 14 may optionally further include that the pulse width of the one or more sixth voltage pulses is greater than the pulse width of the one or more fifth voltage pulses.

In Example 17, the memory cell arrangement of any one of examples 13 to 15 may optionally further include that the total on-time of the one or more sixth voltage pulses is greater than the total on-time of the one or more fifth voltage pulses, or that a sum of pulse widths of the one or more sixth voltage pulses is greater than a sum of pulse widths of the one or more fifth voltage pulses.

In Example 18, the memory cell arrangement of any one of examples 13 to 17 may optionally further include that the number of the one or more sixth voltage pulses is greater than the number of the one or more fifth voltage pulses.

In Example 19, the memory cell arrangement of any one of examples 1 to 18 may optionally further include that checking whether or not the at least one memory cell is in the memory state includes comparing a current value of a current outputted by the field-effect transistor structure with a reference value (e.g., a reference current value or a reference voltage value).

In Example 20, the memory cell arrangement of example 19 may optionally include that the current outputted by the field-effect transistor structure is drain current or a source/drain current of the field-effect transistor structure.

In Example 21, the memory cell arrangement of any one of examples 1 to 20 may optionally further include that writing the at least one memory cell includes bringing the at least one memory cell from one of at least two memory states of the at least one memory cell into another one of the at least two memory states of the at least one memory cell.

In Example 22, the memory cell arrangement of any one of examples 1 to 21 may optionally further include that the memory element is disposed between a channel region of the field-effect transistor structure and a gate electrode of the field-effect transistor structure.

In Example 23, the memory cell arrangement of any one of examples 1 to 22 may optionally further include that the memory element of the at least one memory cell includes one or more remanent-polarizable layers.

In Example 24, the memory cell arrangement of example 23 may optionally further include that writing the at least one memory cell into a memory state includes switching a polarization state of the one or more remanent-polarizable layers.

In Example 25, the memory cell arrangement of example 23 or 24 may optionally further include that the one or more remanent-polarizable layers include at least one ferroelectric material.

As an example, the ferroelectric material may include hafnium oxide or zirconium oxide.

In Example 26, the memory cell arrangement of any one of examples 1 to 25 may optionally further include that one or more first voltage pulses have a pulse height in the range from about 1 V to about 10 V, and/or a pulse width in the range from about 1 ns to about 100 ns, and/or a number of pulses in the range from 1 to 10000.

In Example 27, the memory cell arrangement of any one of examples 1 to 26 may optionally further include that one or more second voltage pulses have a pulse height in the range from about 1 V to about 10 V, and/or a pulse width in the range from about 1 ns to about 100 ns, and/or a number of pulses in the range from 1 to 10000.

Example 28 is a memory cell arrangement including: a control circuit configured to carry out a write operation to write at least one memory cell of the memory cell arrangement into a memory state, wherein the at least one memory cell includes a field-effect transistor structure and a memory element integrated in the field-effect transistor structure, and wherein the write operation includes: providing one or more first voltage pulses at the at least one memory cell, the one or more first voltage pulses having a first polarity, providing one or more second voltage pulses at the at least one memory cell, the one or more second voltage pulses having a second polarity opposite the first polarity, checking, whether or not the at least one memory cell is in the memory state, and, in the case that the at least one memory cell is not in the memory state, providing one or more third voltage pulses at the at least one memory cell, the one or more third voltage pulses having the second polarity.

In Example 29, the memory cell arrangement of example 28 may optionally further include that the one or more third voltage pulses are distinct from the one or more second voltage pulses with respect to at least one of pulse height, pulse width, sum of pulse widths, or number of pulses.

In Example 30, the memory cell arrangement of example 28 or 29 may optionally further include that the write operation further includes after providing the one or more third voltage pulses checking, whether or not the at least one memory cell is in the memory state.

In Example 31, the memory cell arrangement of example 30 may optionally further include, in the case that the at least one memory cell is not in the memory state, providing one or more fourth voltage pulses at the at least one memory cell, the one or more fourth voltage pulses having the first polarity.

In Example 32, the memory cell arrangement of example 31 may optionally further include that the one or more fourth voltage pulses are distinct from the one or more first voltage pulses with respect to at least one of pulse height, pulse width, sum of pulse widths, or number of pulses.

In Example 33, the memory cell arrangement of any one of examples 28 to 32 may optionally further include any feature of the memory cell arrangement of any one of examples 1 to 27, where appropriate.

Example 34 is a method for writing a memory cell into a memory state, the method including: providing one or more first voltage pulses at the memory cell, the one or more first voltage pulses having a first pulse height and a first polarity; providing one or more second voltage pulses at the memory cell, the one or more second voltage pulses having a second polarity opposite the first polarity; checking whether or not the at least one memory cell is in the memory state; and, in the case that the at least one memory cell is not in the memory state, providing one or more third voltage pulses at the at least one memory cell, the one or more third voltage pulses having the second polarity, wherein the one or more third voltage pulses are distinct from the one or more second voltage pulses with respect to at least one of the following: a pulse height of the one or more third voltage pulses is different from a pulse height of the one or more second voltage pulses, a pulse width of the one or more third voltage pulses is different from a pulse width of the one or more second voltage pulses, a total on-time of the one or more third voltage pulses is different from a total on time of the one or more second voltage pulses, and/or a number of the one or more third voltage pulses is different from a number of the one or more second voltage pulses.

In Example 35, the method of example 34 may optionally further include any feature of the memory cell arrangement of any one of examples 1 to 27 or 28 to 33, where appropriate.

Example 36 is a computer program product including a plurality of program instructions that may be embodied in a non-transitory computer readable medium, which when executed by one or more processors cause the one or more processors to execute the method of example 34 or 35.

According to various aspects, references are made to one or more first voltage pulses and one or more second voltage pulses. It is noted that, according to some aspects, one or more additional voltage pulses (e.g., related to the writing and/or de-trapping of the memory cell or not) may be present or provided between the one or more first voltage pulses and the one or more second voltage pulses. In other aspects, no additional voltage pulses that are related to the writing and/or de-trapping of the memory cell may be present or provided between the one or more first voltage pulses and the one or more second voltage pulses. The same may apply in a similar way to the one or more second voltage pulses and one or more third voltage pulses, the one or more third voltage pulses and one or more fourth voltage pulses, the one or more fourth voltage pulses and one or more fifth voltage pulses, and/or the one or more fifth voltage pulses and one or more sixth voltage pulses.

It is noted that one or more functions described herein with reference to a memory cell, a remanent polarizable layer, a memory cell arrangement, etc. may be accordingly part of a method, e.g. part of a method for operating a memory cell arrangement. Vice versa, one or more functions described herein with reference to a method, e.g. with reference to a method for operating a memory cell arrangement, may be implemented accordingly in a device or in a part of a device, for example, in a remanent polarizable layer, a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. Memory cell arrangement comprising:
a control circuit configured to carry out a write operation to write at least one memory cell of the memory cell arrangement into a memory state, wherein the at least one memory cell comprises a field-effect transistor structure and a memory element integrated in the field-effect transistor structure, and wherein the write operation comprises:
 providing one or more first voltage pulses at the at least one memory cell, the one or more first voltage pulses having a first polarity;
 providing one or more second voltage pulses at the at least one memory cell, the one or more second voltage pulses having a second polarity opposite the first polarity;
 checking whether or not the at least one memory cell is in the memory state; and,
 in the case that the at least one memory cell is not in the memory state, providing one or more third voltage pulses at the at least one memory cell, the one or more third voltage pulses having the second polarity, wherein the one or more third voltage pulses are different from the one or more second voltage pulses with respect to at least one of the following:
  a pulse height of the one or more third voltage pulses is different from a pulse height of the one or more second voltage pulses,
  a pulse width of the one or more third voltage pulses is different from a pulse width of the one or more second voltage pulses,
  a total on-time of the one or more third voltage pulses is different from a total on-time of the one or more second voltage pulses, and/or
  a number of the one or more third voltage pulses is different from a number of the one or more second voltage pulses.

2. The memory cell arrangement according to claim 1, wherein the pulse height of the one or more third voltage pulses is greater than a second pulse height of the one or more second voltage pulses.

3. The memory cell arrangement according to claim 1, wherein the pulse width of the one or more third voltage pulses is greater than the pulse width of the one or more second voltage pulses.

4. The memory cell arrangement according to claim 1, wherein the total on-time of the one or more third voltage pulses is greater than the total on-time of the one or more second voltage pulses, or wherein a sum of pulse widths of the one or more third voltage pulses is greater than a sum of pulse widths of the one or more second voltage pulses.

5. The memory cell arrangement according to claim 1, wherein the number of the one or more third voltage pulses is greater than the number of the one or more second voltage pulses.

6. The memory cell arrangement according to claim 1, wherein the write operation further comprises:
 after providing the one or more third voltage pulses at the at least one memory cell,
 checking whether or not the at least one memory cell is in the memory state; and,
 in the case that the at least one memory cell is not in the memory state,
 providing one or more fourth voltage pulses at the at least one memory cell, the one or more fourth voltage pulses having the first polarity, wherein the one or more fourth voltage pulses are different from the one or more first voltage pulses with respect to at least one of the following:
  a pulse height of the one or more fourth voltage pulses is different from a first pulse height of the one or more first voltage pulses,
  a pulse width of the one or more fourth voltage pulses is different from a pulse width of the one or more first voltage pulses,
  a total on-time of the one or more fourth voltage pulses is different from a total on-time of the one or more first voltage pulses, and/or
  a number of the one or more fourth voltage pulses is different from a number of the one or more first voltage pulses.

7. The memory cell arrangement according to claim 6, wherein the write operation further comprises:
 after providing the one or more fourth voltage pulses at the at least one memory cell,
 providing one or more fifth voltage pulses at the at least one memory cell, the one or more fifth voltage pulses having the second polarity.

8. The memory cell arrangement according to claim 7,
 wherein a pulse height of the one or more fifth voltage pulses is substantially equal to the pulse height of the one or more second voltage pulses, and/or
 wherein a pulse width of the one or more fifth voltage pulses is substantially equal to the pulse width of the one or more second voltage pulses, and/or
 wherein a total on-time of the one or more fifth voltage pulses is substantially equal to the total on-time of the one or more second voltage pulses, and/or
 wherein a number of the one or more fifth voltage pulses is substantially equal to the number of the one or more second voltage pulses.

9. The memory cell arrangement according to claim 7, wherein the write operation further comprises:
 after providing the one or more fifth voltage pulses at the at least one memory cell, checking whether or not the at least one memory cell is in the memory state, and,
 in the case that the at least one memory cell is not in the memory state,
 providing one or more sixth voltage pulses at the at least one memory cell, the one or more sixth voltage pulses having the second polarity, wherein the one or more sixth voltage pulses are different from the one or more fifth voltage pulses with respect to at least one of the following:
  a pulse height of the one or more sixth voltage pulses is different from the pulse height of the one or more fifth voltage pulses,
  a pulse width of the one or more sixth voltage pulses is different from the pulse width of the one or more fifth voltage pulses,
  a total on-time of the one or more sixth voltage pulses is different from the total on-time of the one or more fifth voltage pulses, and/or
  a number of the one or more sixth voltage pulses is different from the number of the one or more fifth voltage pulses.

10. The memory cell arrangement according to claim 1, wherein checking whether or not the at least one memory cell is in the memory state comprises comparing a value associated with a current outputted by the field-effect transistor structure with a reference value.

11. The memory cell arrangement according to claim 1, wherein writing the at least one memory cell comprises bringing the at least one memory cell from one of at least two memory states of the at least one memory cell into another one of the at least two memory states of the at least one memory cell.

12. The memory cell arrangement according to claim 1, wherein the memory element of the at least one memory cell comprises one or more remanent-polarizable layers.

13. The memory cell arrangement according to claim 12, wherein writing the at least one memory cell into a memory state comprises switching a polarization state of the one or more remanent-polarizable layers.

14. Memory cell arrangement comprising:
a control circuit configured to carry out a write operation to write at least one memory cell of the memory cell arrangement into a memory state, wherein the at least one memory cell comprises a field-effect transistor structure and a memory element integrated in the field-effect transistor structure, and wherein the write operation comprises:
   providing one or more first voltage pulses at the at least one memory cell, the one or more first voltage pulses having a first polarity,
   providing one or more second voltage pulses at the at least one memory cell, the one or more second voltage pulses having a second polarity opposite the first polarity,
wherein a pulse height of the one or more first voltage pulses is greater than a pulse height of the one or more second voltage pulses,
   checking whether or not the at least one memory cell is in the memory state, and,
   in the case that the at least one memory cell is not in the memory state,
      providing one or more third voltage pulses at the at least one memory cell, the one or more third voltage pulses having the second polarity.

15. The memory cell arrangement according to claim 14, wherein the one or more third voltage pulses are distinct from the one or more second voltage pulses with respect to at least one of pulse height, pulse width, sum of pulse widths, or number of pulses.

16. The memory cell arrangement according to claim 14, wherein the write operation further comprises:
   after providing the one or more third voltage pulses, checking whether or not the at least one memory cell is in the memory state, and,
   in the case that the at least one memory cell is not in the memory state, providing one or more fourth voltage pulses at the at least one memory cell, the one or more fourth voltage pulses having the first polarity.

17. The memory cell arrangement according to claim 16, wherein the one or more fourth voltage pulses are distinct from the one or more first voltage pulses with respect to at least one of pulse height, pulse width, sum of pulse widths, or number of pulses.

18. Method for writing at least one memory cell into a memory state, the method comprising:
   providing one or more first voltage pulses at the at least one memory cell, the one or more first voltage pulses having a first polarity;
   providing one or more second voltage pulses at the at least one memory cell, the one or more second voltage pulses having a second polarity opposite the first polarity;
   checking whether or not the at least one memory cell is in the memory state; and,
   in the case that the at least one memory cell is not in the memory state,
   providing one or more third voltage pulses at the at least one memory cell, the one or more third voltage pulses having the second polarity,
   wherein the one or more third voltage pulses are distinct from the one or more second voltage pulses with respect to at least one of the following:
      a pulse height of the one or more third voltage pulses is different from a pulse height of the one or more second voltage pulses,
      a pulse width of the one or more third voltage pulses is different from a pulse width of the one or more second voltage pulses,
      a total on-time of the one or more third voltage pulses is different from a total on-time of the one or more second voltage pulses, and/or
      a number of the one or more third voltage pulses is different from a number of the one or more second voltage pulses.

19. A computer program product including a plurality of program instructions that may be embodied in a non-transitory computer readable medium, which when executed by one or more processors cause the one or more processors to execute the method of claim 18.

20. Memory cell arrangement comprising:
a control circuit configured to carry out a write operation to write at least one memory cell of the memory cell arrangement into a memory state, wherein the at least one memory cell comprises a field-effect transistor structure and a memory element integrated in the field-effect transistor structure, and wherein the write operation comprises:
   providing one or more first voltage pulses at the at least one memory cell, the one or more first voltage pulses having a first polarity,
   providing one or more second voltage pulses at the at least one memory cell, the one or more second voltage pulses having a second polarity opposite the first polarity,
   checking, whether or not the at least one memory cell is in the memory state, and,
   in the case that the at least one memory cell is not in the memory state,
   providing one or more third voltage pulses at the at least one memory cell, the one or more third voltage pulses having the second polarity,
   after providing the one or more third voltage pulses, checking whether or not the at least one memory cell is in the memory state, and,
   in the case that the at least one memory cell is not in the memory state,
providing one or more fourth voltage pulses at the at least one memory cell, the one or more fourth voltage pulses having the first polarity.

* * * * *